United States Patent
Tsunoda et al.

(10) Patent No.: US 9,160,521 B2
(45) Date of Patent: Oct. 13, 2015

(54) TIMING SIGNAL GENERATION CIRCUIT

(71) Applicant: FUJITSU LIMITED, Kawasaki-shi, Kanagawa (JP)

(72) Inventors: Yukito Tsunoda, Isehara (JP); Takayuki Shibasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/570,256

(22) Filed: Dec. 15, 2014

(65) Prior Publication Data

US 2015/0207618 A1 Jul. 23, 2015

(30) Foreign Application Priority Data

Jan. 23, 2014 (JP) .................. 2014-010352

(51) Int. Cl.
*H03D 3/24* (2006.01)
*H04L 7/033* (2006.01)
*H03L 7/16* (2006.01)

(52) U.S. Cl.
CPC ............... *H04L 7/0331* (2013.01); *H03L 7/16* (2013.01)

(58) Field of Classification Search
CPC ....... H03L 7/0812; H03L 7/0891; H03L 7/08; H03L 7/0998; H03L 7/089; H04L 7/0025; H03K 2005/00052; H03D 13/004
USPC ......................................................... 375/375
See application file for complete search history.

(56) References Cited

U.S. PATENT DOCUMENTS

2002/0070783 A1* 6/2002 Saeki ........................... 327/235
2003/0198105 A1 10/2003 Yamaguchi et al.
2004/0113656 A1 6/2004 Sato
2005/0258883 A1* 11/2005 Farjad-rad et al. ............ 327/295
2007/0058768 A1* 3/2007 Werner ......................... 375/376
2009/0179674 A1 7/2009 Tamura et al.

(Continued)

FOREIGN PATENT DOCUMENTS

JP 2001-217682 8/2001
JP 2002-123332 4/2002

(Continued)

OTHER PUBLICATIONS

Kreienkamp et al., "A 10-Gb/s CMOS Clock and Data Recovery Circuit With an Analog Phase Interpolator", *IEEE Journal of Solid-State Circuits*, Mar. 2005, pp. 736-743, vol. 40, No. 3.

*Primary Examiner* — Don N Vo

(74) *Attorney, Agent, or Firm* — Staas & Halsey LLP

(57) ABSTRACT

A timing signal generation circuit includes: a phase comparison circuit to detect a phase difference between an input signal and a recovery clock; a control voltage signal generation unit to generate two phase differential control voltage signals, based on the detected phase difference; a timing detection circuit to detect timing in which the control voltage signals are inverted, and generate quadrant information of the phase difference of the control voltage signals and an inverted timing signal; a synthesized phase selection circuit to select clocks of two phases which are used for phase interpolation for each predetermined angle, from clocks of a plurality of phases, and generate a phase control signal for the phase interpolation, based on the control voltage signals and the quadrant information; and a phase synthesis circuit to generate the recovery clock by synthesizing the selected clocks of two phases, based on the phase control signal.

9 Claims, 19 Drawing Sheets

(56) References Cited

U.S. PATENT DOCUMENTS

2011/0221506 A1  9/2011  Tamura et al.
2013/0314142 A1  11/2013  Tamura et al.

FOREIGN PATENT DOCUMENTS

| | | |
|---|---|---|
| JP | 2003-309543 | 10/2003 |
| JP | 2004-88693 | 3/2004 |

* cited by examiner

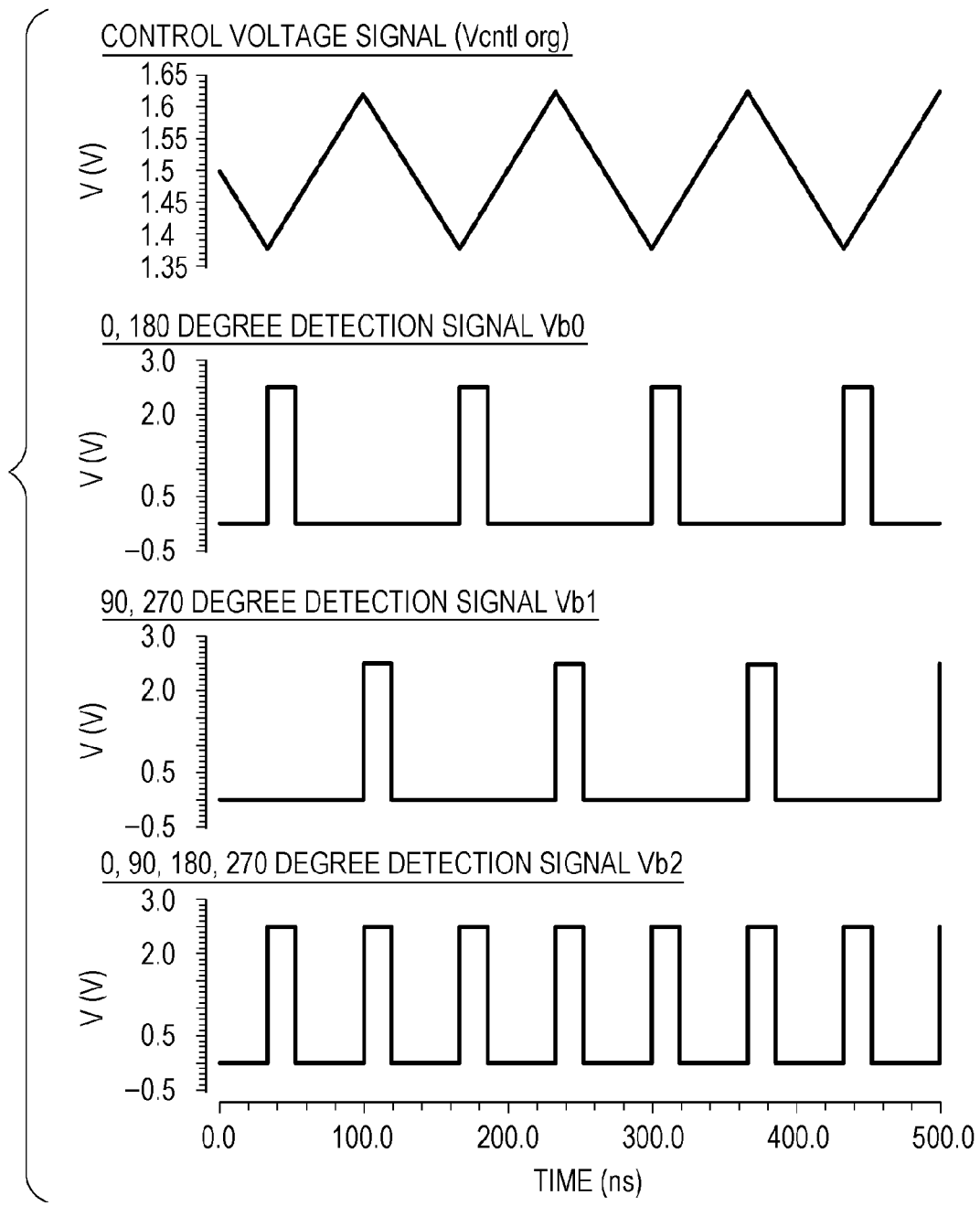

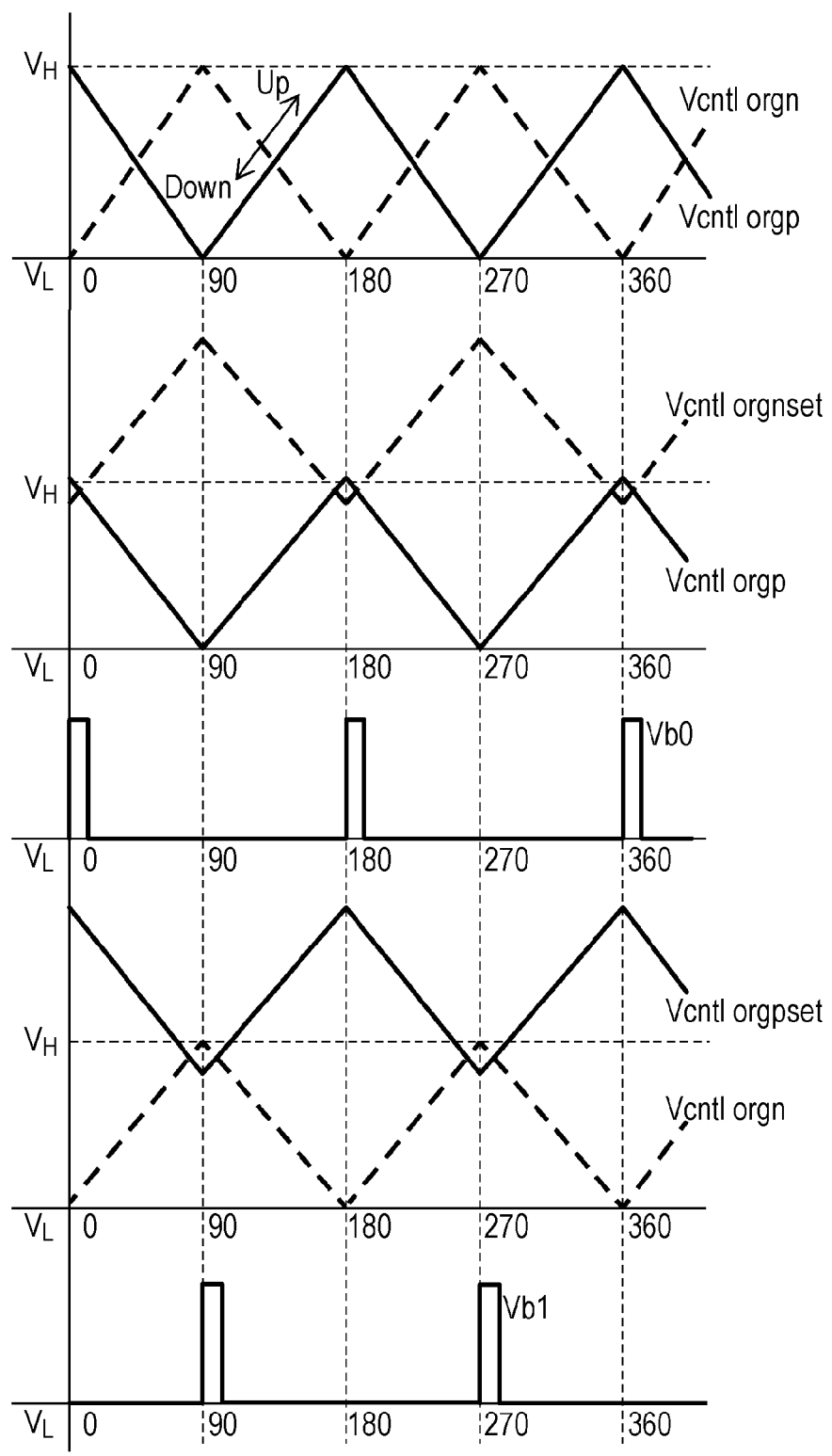

TIMING SIGNAL GENERATION CIRCUIT

CROSS-REFERENCE TO RELATED APPLICATION

This application is based upon and claims the benefit of priority of the prior Japanese Patent Application No. 2014-010352, filed on Jan. 23, 2014, the entire contents of which are incorporated herein by reference.

FIELD

The embodiments discussed herein are related to a timing signal generation circuit.

BACKGROUND

With the improved performance of an information processing apparatus such as a device or a server for communication backbone, the data rate of signal transmission and reception has to increase inside and outside the device. In a transceiver which operates at a high speed, a clock and data recovery (CDR) circuit which recovers an optimal timing clock from a data signal is provided. Multiple architectures have been proposed as a method for realizing the CDR circuit. For example, a method for causing a reference clock to track the phase of received input data is known. In addition, a method is known, in which a phase difference between a recovery clock and input data is detected, and a recovery clock is generated by phase-shifting a reference clock in accordance with the detected phase difference. A timing signal generation circuit detects a phase difference between a recovery clock and input data, and generates a recovery clock by phase-shifting a reference clock in accordance with the detected phase difference.

A timing signal generation circuit performs phase interpolation for synthesizing a recovery clock by weighting multiple reference clocks with phases different from each other. In order to perform phase interpolation with regard to all phases, clocks of four phases, each being shifted by 90 degrees, are used generally. A quadrant of the phase difference is determined by using a detected phase difference between the recovery clock and input data, and weights of clocks of multiple phases which are synthesized according to the phase difference are further determined.

Performing the determination of the quadrant and the weight by means of digital processing has been proposed. Through the digital processing, a control value can be freely set, and it is possible to easily cope with even a change of quadrant, but a rounding error (quantization error) occurs, and phase variation due to code variation at the time of phase tracking caused by the error occurs. In order to reduce the quantization error or the phase variation due to the error, the number of bits of digital data has to be increased, but in this case, there are problems that a circuit size becomes larger, time for digital processing becomes longer, and response speed is decreased.

Non-Patent document 1, "'A 10-Gb/s CMOS Clock and Data Recovery Circuit With an Analog Phase Interpolator' Rainer Kreientkamp, et al., IEEE Journal of Solid-State Circuits, Vol. 40, No. 3, pp. 736-743, March 2005" proposes that determination of the quadrant and the weight is realized by analog processing. According to the Non-patent document 1, phase control signals (currents) with four phases corresponding to a phase control digital code are continuously biased at all times, a bias current rate is changed, and a control is performed by interlocking between two phase control of 0 degrees and 180 degrees and two phase control of 90 degrees and 270 degrees. There is a problem that the control is switched near a value in which clocks of phases of 0 degrees and 180 degrees become equal to clocks of phases of 90 degrees and 270 degrees, and thus, phase variation caused by synthesis (interpolation rate) easily occurs.

Japanese Laid-open Patent Publication No. 2001-217682, Japanese Laid-open Patent Publication No. 2003-309543, and Japanese Laid-open Patent Publication No. 2002-123332 are examples of the related art.

SUMMARY

According to an aspect of the invention, a timing signal generation circuit includes: a phase comparison circuit configured to detect a phase difference between an input signal and a recovery clock; a control voltage signal generation unit configured to generate two phase differential control voltage signals which are inverted for each predetermined angle and which change between a high level and a low level of the control voltage signals, based on the detected phase difference; a timing detection circuit configured to detect timing in which the control voltage signals are inverted, and generate quadrant information of the phase difference of the control voltage signals and an inverted timing signal; a synthesized phase selection circuit configured to select clocks of two phases which are used for phase interpolation for each predetermined angle, from clocks of a plurality of phases, and generate a phase control signal for synthesizing the selected clocks of two phases for the phase interpolation, based on the control voltage signals and the quadrant information; and a phase synthesis circuit configured to generate the recovery clock by synthesizing the selected clocks of two phases, based on the phase control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9A illustrates an example including a differential bias current source using a p type transistor, and FIG. 9B illustrates an example including a differential bias current source using an n type transistor;

FIG. 10A illustrates the circuit configuration, and FIG. 10B illustrates a timing chart of the operation;

FIG. 11A illustrates the circuit configuration, and FIG. 11B illustrates a timing chart of the operation;

FIG. 12A illustrates the circuit configuration of the synthesized phase selection circuit, and FIG. 12B illustrates the circuit configuration of the phase synthesis circuit;

FIG. 13 is a diagram illustrating simulation results of a control voltage signal, a 0 and 180 degree detection signal, a 90 and 270 degree detection signal, and a 0, 90, 180 and 270 degree detection signal;

FIG. 19 is a timing chart illustrating an operation of a 0 and 180 degree detection circuit and a 90 and 270 degree detection circuit according to a second embodiment.

DESCRIPTION OF EMBODIMENTS

Hereinafter, embodiments of a timing signal generation circuit, in which phase variation is reduced by analog processing, with a simple circuit configuration will be described.

Before the embodiments are described, a general timing signal generation circuit with phase interpolation (PI) will be described.

Figure 1:
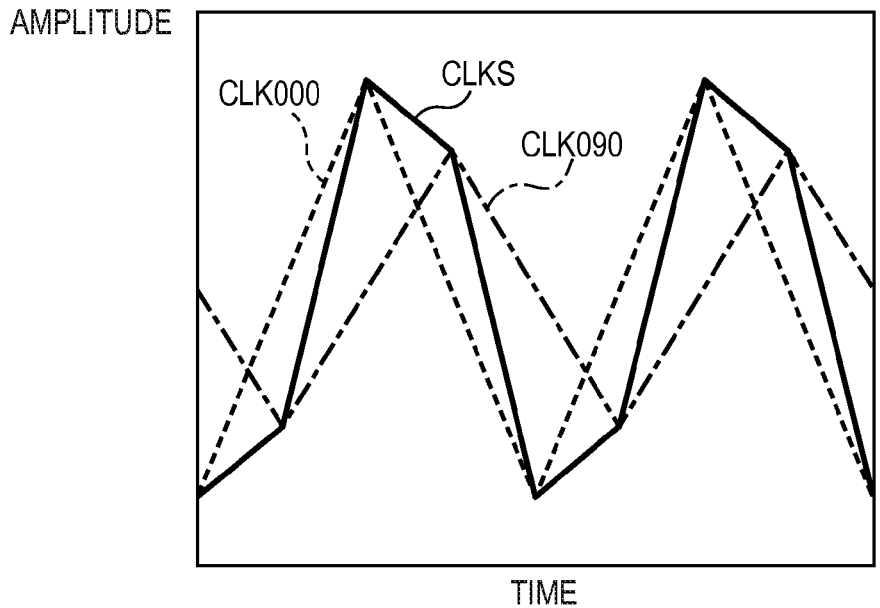
FIG. 1 is a diagram for explaining phase shift clock generation performed by phase interpolation.

FIG. 1 is a diagram for explaining phase shift clock generation performed by phase interpolation. In a general phase interpolation, phase is changed by the addition theorem of trigonometric function. In the addition theorem, the result of multiplying sin θ and cos θ is summed according to the amount that is desired to be phase-shifted with respect to a sin wave and a cos wave phase-shifted by 90° with respect to the sin wave, and thus, a phase-shifted signal is generated.

A signal in which a sine wave of an angular frequency $\phi t$ is shifted by phase θ is represented by $\sin(\omega t - \theta)$, decomposed to $\sin(\omega t)\cos\theta - \cos(\theta t)\sin\theta$, and approximates CLK0×a−CLK90×(1−a). Here, "a" is a value that is determined depending on the phase-shifted amount. However, it is difficult to produce a complete sine wave using a narrow band filter, and thus, actually, arithmetic processing is performed by approximating a sine wave to a triangular wave.

FIG. 1 is a diagram for explaining that two phase-shifted by 90° triangular waves are synthesized, and thereby a signal which is shifted to an intermediate phase is generated.

CLK000 is set as a first triangular wave, CLK090 is set as a second triangular wave which is phase-shifted by 90° with respect to the first triangular wave, and a synthetic wave CLKS which is synthesized by using a=0.6 is illustrated. The phase of the synthetic wave CLKS is shifted with respect to the first triangular wave CLK000.

In order to synthesize a phase shift signal with respect to all phases, three triangular wave signals may be used, but in general, clocks $\phi_0$, $\phi_{90}$, $\phi_{180}$, and $\phi_{270}$ of four phases which are different by 90 degrees in phase from each other are used. Hereinafter, a case where the clocks of four phases are used is taken as an example, but the embodiments described later are not limited to this, and can be applied even to a case where clocks of three phases, eight phases or the like are used.

For example, in a receiving circuit, the frequency of an input data signal, that is, the frequency of a transmission clock approximates to the frequency of a received clock from a clock source of the receiving circuit, but the result is not completely equal. For this reason, the phase of the input data signal and the phase of the received clock are gradually shifted, and a phase difference rotates. The weight of the clocks of a plurality of phases synthesized according to a rotation position of the phase difference is set according to the phase difference. For this reason, the timing signal generation circuit detects a phase difference between the phase of the input data signal and the received clock, and determines a weight in the synthesis.

Figure 2:
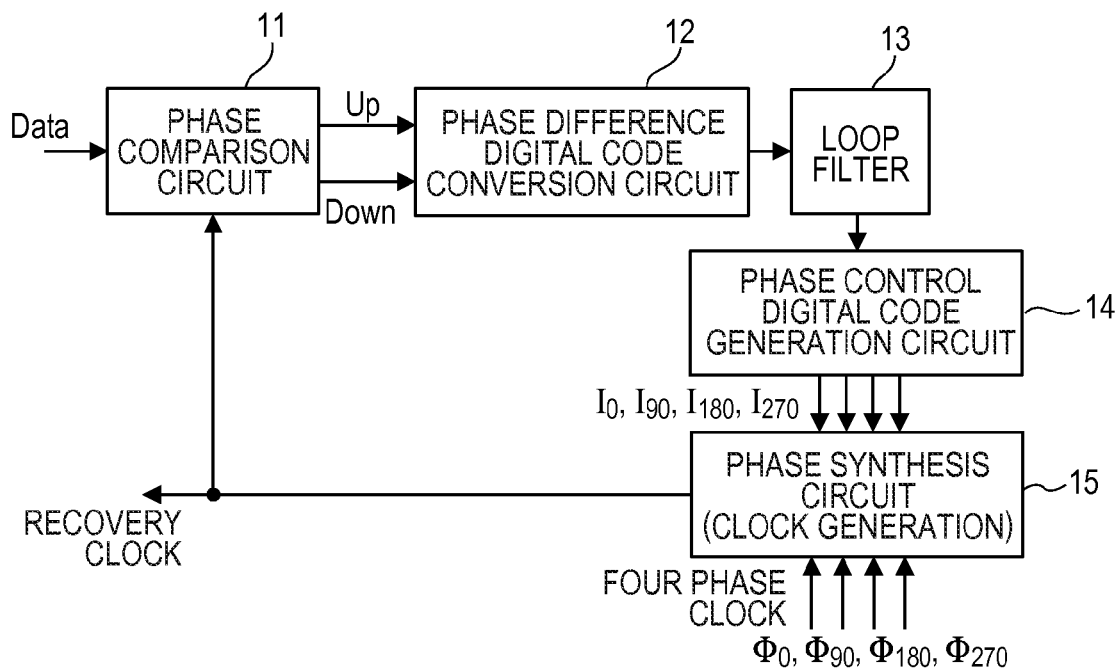
FIG. 2 is a diagram illustrating a configuration of a timing signal generation circuit that performs clock data recovery of phase interpolation (PI) type using a general digital code.

FIG. 2 is a diagram illustrating a configuration of a timing signal generation circuit which performs clock data recovery of phase interpolation (PI) type using a general digital code. The timing signal generation circuit of FIG. 2 includes a phase comparison circuit 11, a phase difference digital code conversion circuit 12, a loop filter 13, a phase control digital code generation circuit 14, and a phase synthesis circuit (clock generation circuit) 15. The phase comparison circuit 11 detects a phase difference between an input data signal Data and a recovery clock, and outputs an increase signal Up or a decrease signal Down of clock timing according to the phase difference. The phase difference digital code conversion circuit 12 outputs a phase difference digital code corresponding to signals Up and Down. The loop filter 13 removes high frequency components of the phase difference digital code through digital processing. The phase control digital code generation circuit 14 generates a phase control digital code based on the phase difference digital code in which the high frequency components are removed, and generates phase control signals (currents) $I_0$, $I_{90}$, $I_{180}$, and $I_{270}$ of analog signals corresponding to the code. The phase synthesis circuit 15 synthesizes clocks of four phases $\phi_0$, $\phi_{90}$, $\phi_{180}$, and $\phi_{270}$ according to the phase control signal which represents the weight of the clocks of each phase. The phase synthesis circuit 15 is realized by a circuit which calculates an amount of total currents flowing from four current sources to which, for example, clocks of four phases $\phi_0$, $\phi_{90}$, $\phi_{180}$, and $\phi_{270}$ are input, and changes an amount of currents (bias amount) of four current sources according to the phase control signals $I_0$, $I_{90}$, $I_{180}$, and $I_{270}$.

Figure 3:
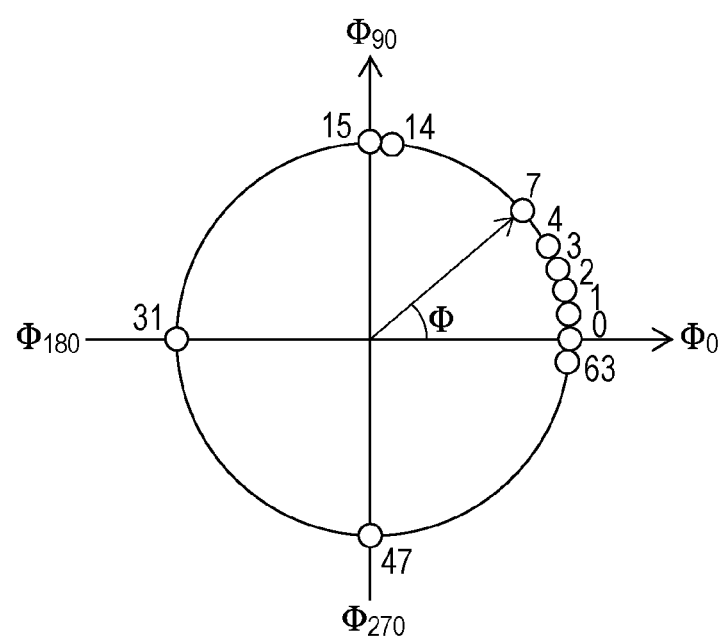
FIG. 3 is a diagram for explaining resolution of CDR of phase interpolation (PI) type using a digital code.

FIG. 3 is a diagram for explaining resolution of CDR of phase interpolation (PI) type using a digital code. As illustrated in FIG. 3, the phase difference digital code represents phases from 0 degrees to 360 degrees, and the phase control digital code represents the weight of the synthesized four clocks ($\phi_0$, $\phi_{90}$, $\phi_{180}$, and $\phi_{270}$) of phases adjacent to each phase.

Since digital control is performed, it is possible to freely set a control value through the digital signal processing. For example, as illustrated in FIG. 3, even when a maximum value "63" is transitioned to a minimum value "0" by phase up, it can be easily realized by the digital signal processing.

Since the digital code represents a phase in a digital value, an error (quantization error) caused by rounding occurs, and due to the errors, phase variation is generated caused by code variation at the time of phase tracking. In order to reduce the quantization error or the phase variation due to the error, the number of bits of digital data has to be increased, but in this case, there is a problem that a circuit size becomes larger. In addition, if the number of bits is increased, there are problems that time for digital processing becomes longer, and response speed is decreased.

Thus, the Non-patent document 1 proposes that the phase difference digital code conversion circuit 12, the loop filter 13 and the phase control digital code generation circuit 14 are realized by analog processing. According to the Non-patent document 1, the phase control signals $I_0$, $I_{90}$, $I_{180}$, and $I_{270}$ are continuously biased at all times, a bias current rate is changed, and a control is performed by interlocking between two phase control of $I_0$ and $I_{180}$ and two phase control of $I_{90}$ and $I_{270}$. There is a problem that since the control is switched near 0.5 $I_T$ in which reverse phases of $I_0$ and $I_{180}$ and $I_{90}$ and $I_{270}$ become equal and thus, phase variation caused by synthesis (interpolate) easily occurs.

In the embodiments described hereinafter, since a digital control signal is just used for four quadrant detection and selection, it is possible to perform a high speed operation because the digital detection operation is performed only at the time of four quadrant selection and thereby the frequency is lowered, and in addition, the timing signal generation circuit is realized, in which there is no quantization error caused by the digital processing, and the phase variation is decreased by the analog processing and a simple circuit configuration. In addition, since switching becomes 0×It, and 1×It, and it is performed at a condition of maximum and minimum, even if current variation occurs due to switching, a change of current rate which is an amount of phase controls is decreased, and phase variation hardly occurs.

First Embodiment

Figure 4:
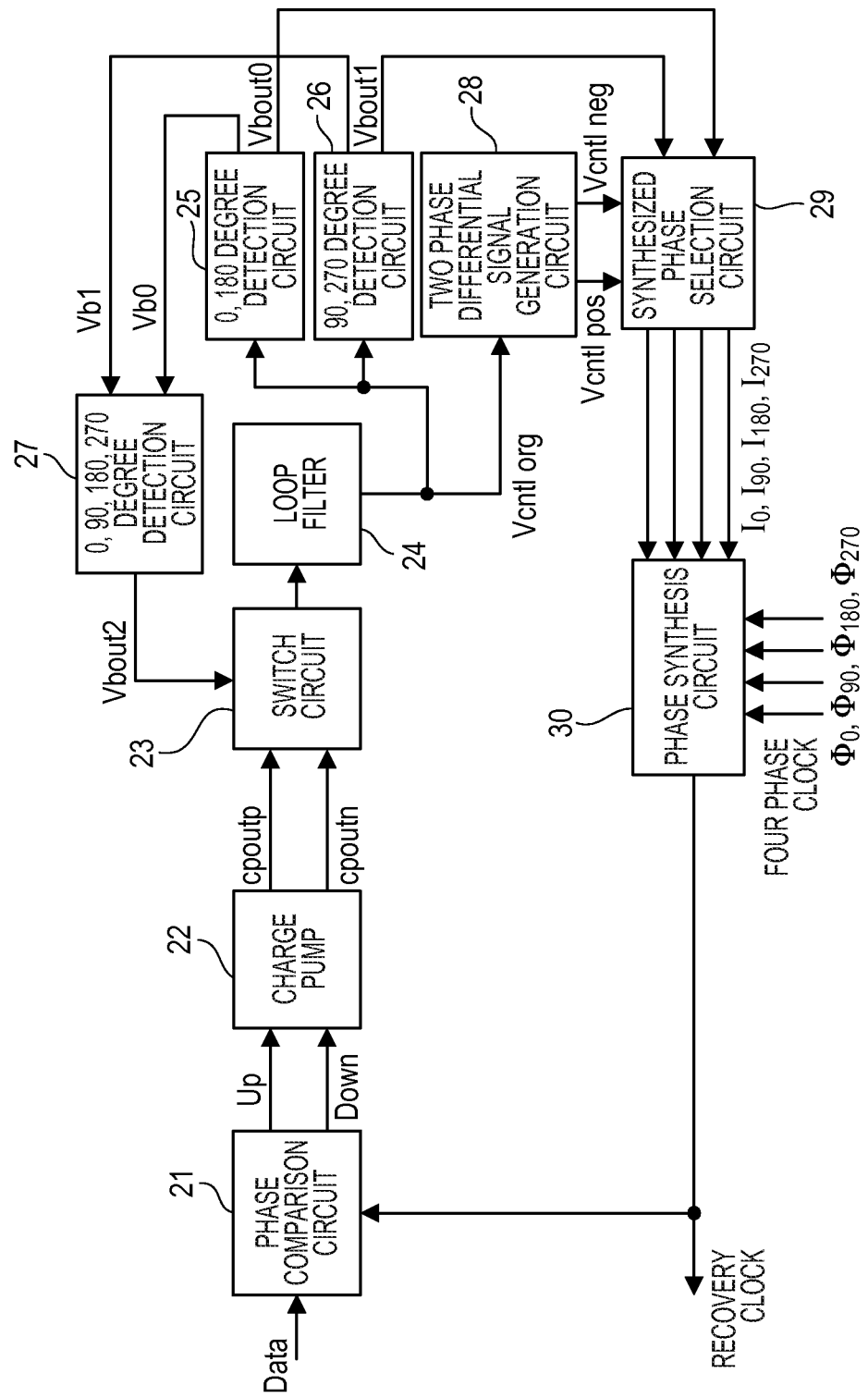
FIG. 4 is a diagram illustrating a configuration of a timing signal generation circuit according to a first embodiment.

FIG. 4 is a diagram illustrating a configuration of a timing signal generation circuit according to a first embodiment. The timing signal generation circuit according to the first embodiment includes a phase comparison circuit 21, a charge pump 22, a switch circuit 23, a loop filter 24, a 0 and 180 degree detection circuit 25, and a 90 and 270 degree detection circuit 26. The timing signal generation circuit according to the first embodiment further includes a 0, 90, 180 and 270 degree detection circuit 27, a two phase differential signal generation circuit 28, a synthesized phase selection circuit 29, and a phase synthesis circuit 30. The first embodiment is an example in which the loop filter 24 generates a single-phase control voltage signal Vcntl org.

The phase comparison circuit 21 is a circuit which detects a phase difference between the input data signal Data and the recovery clock, and outputs the increase signal Up or the decrease signal Down of clock timing according to the phase difference, and is realized in the same manner as the phase comparison circuit 11 of FIG. 2.

The charge pump 22 outputs a charge signal and a discharge signal according to the signals Up and Down. The switch circuit 23 switches a passing direction of the charge signal and the discharge signal according to an inverted switch signal Vbout2 which is output from the 0, 90, 180 and 270 degree detection circuit 27. The loop filter 24 has capacitance in which charging and discharging are performed by the charge signal and the discharge signal which pass through the switch, and generates the control voltage signal Vcntl org in which high frequency components are removed from a signal obtained by combining the charge signal and the discharge signal. The signal Vcntl org is a signal which is inverted for each predetermined angle (here 90 degrees) according to the phase difference, and changes between a high level and a low level. Configurations and operations of the charge pump 22, the switch circuit 23 and the loop filter 24 will be described later.

The 0 and 180 degree detection circuit 25 detects that the signal Vcntl org reaches a high level, that is, the signal Vcntl org is 0 degrees or 180 degrees, and outputs a 0 and 180 degree detection signal Vb0. Furthermore, the 0 and 180 degree detection circuit 25 outputs a 90 and 270 degree control signal Vbout0 which indicates whether the signal Vcntl org exists at a range (first and second quadrants) from 0 degrees to 180 degrees, or exists at a range (third and fourth quadrants) from 180 degrees to 360 degrees.

The 90 and 270 degree detection circuit 26 detects that the signal Vcntl org reaches a low level, that is, the signal Vcntl org is 90 degrees or 270 degrees, and outputs a 90 and 270 degree detection signal Vb1. Furthermore, the 90 and 270 degree detection circuit 26 outputs a 0 and 180 degree control signal Vbout1 which indicates whether the signal Vcntl org exists at a range (first and fourth quadrants) from 0 degrees to 90 degrees and from 270 degrees to 360 degrees, or exists at a range (second and third quadrants) from 90 degrees to 270 degrees.

The 0, 90, 180 and 270 degree detection circuit 27 outputs an inverted switch signal Vbout2 from the 0 and 180 degree detection signal Vb0 and the 90 and 270 degree detection signal Vb1.

The circuits and operations of the 0 and 180 degree detection circuit 25, the 90 and 270 degree detection circuit 26, and the 0, 90, 180 and 270 degree detection circuit 27 will be described later.

The two phase differential signal generation circuit 28 generates an inverted signal of the control voltage signal Vcntl org, and outputs the signal Vcntl org and the inverted signal as a two phase differential signal Vcntl pos and a signal Vcntl neg. The circuit and operation of the two phase differential signal generation circuit 28 will be described later. Here, a portion which includes the charge pump 22, the switch circuit 23, the loop filter 24 and the two phase differential signal generation circuit 28 is referred to as a control voltage signal generation unit.

The synthesized phase selection circuit 29 selects clocks of two phases which are used in phase interpolation for each four quadrants from clocks of four phases, based on the signals Vcntl pos, Vcntl neg, Vbout0, and Vbout1. The synthesized phase selection circuit 29 further outputs the weight in synthesis in phase interpolation of the selected clocks of two phases. In addition, the synthesized phase selection circuit 29 outputs the phase control signals $I_0$, $I_{90}$, $I_{180}$, and $I_{270}$ such that clocks other than the selected clocks of two phases are actually not selected by setting the weight of the clocks to zero.

The phase synthesis circuit 30 selects the clocks of two phases which are used in synthesis according to the phase control signals $I_0$, $I_{90}$, $I_{180}$, and $I_{270}$, from clocks of multiple phases, and synthesizes according to the weight. In addition, clocks of phases which are not selected are set so as not to contribute to the synthesis according to the weight being zero. The circuits of the synthesized phase selection circuit 29 and the phase synthesis circuit 30 and operations thereof will be described later.

Figure 5:
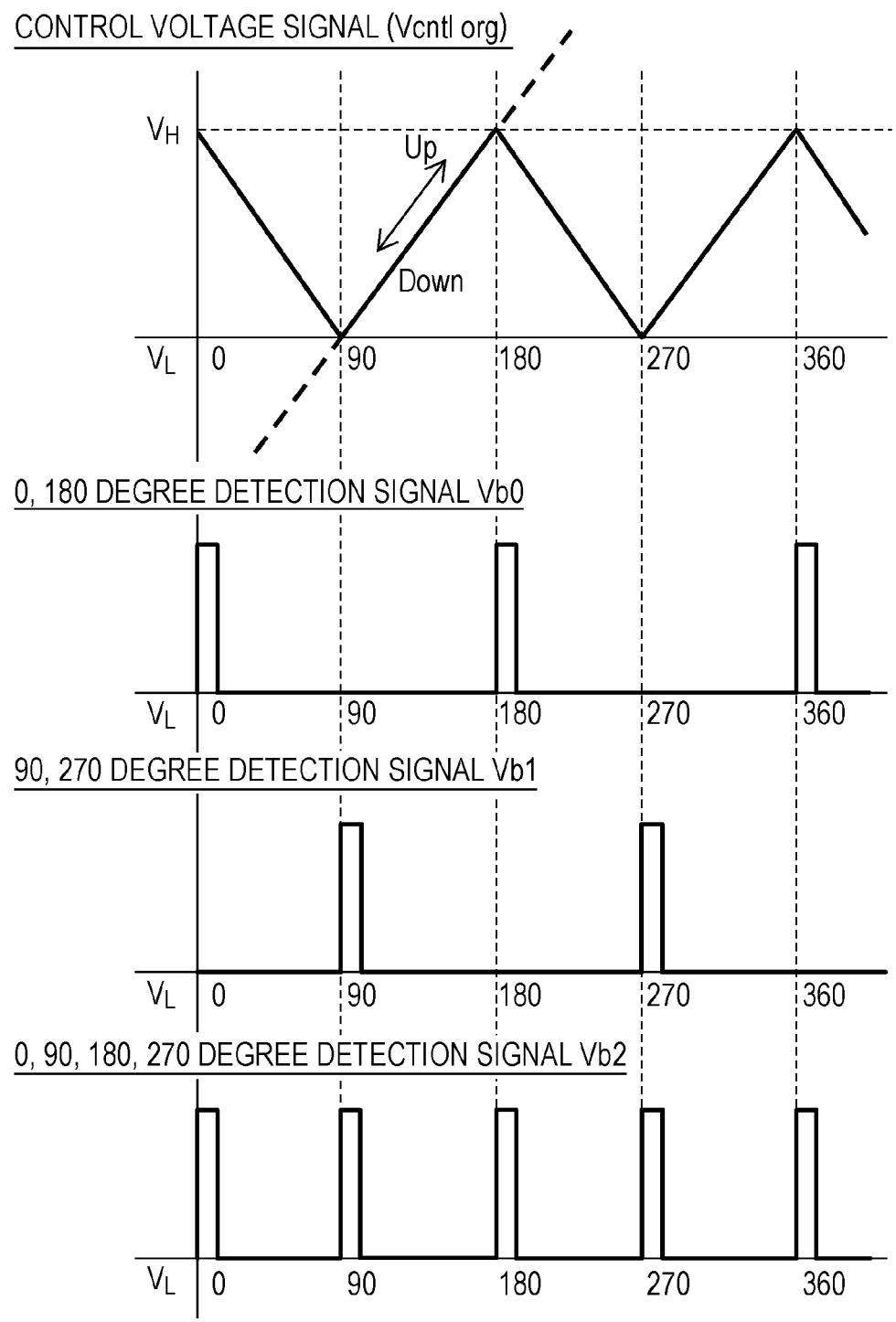
FIG. 5 is a timing chart illustrating changes of a control voltage signal, a 0 and 180 degree detection signal, and a 90 and 270 degree detection signal, according to the first embodiment.

FIG. 5 is a timing chart illustrating changes of the control voltage signal Vcntl org, the 0 and 180 degree detection signal Vb0, and the 90 and 270 degree detection signal Vb1, according to the first embodiment. FIG. 5 also illustrates the 0, 90, 180 and 270 degree detection signal Vb2 which are generated in the 0, 90, 180 and 270 degree detection circuit 27.

Figure 6:
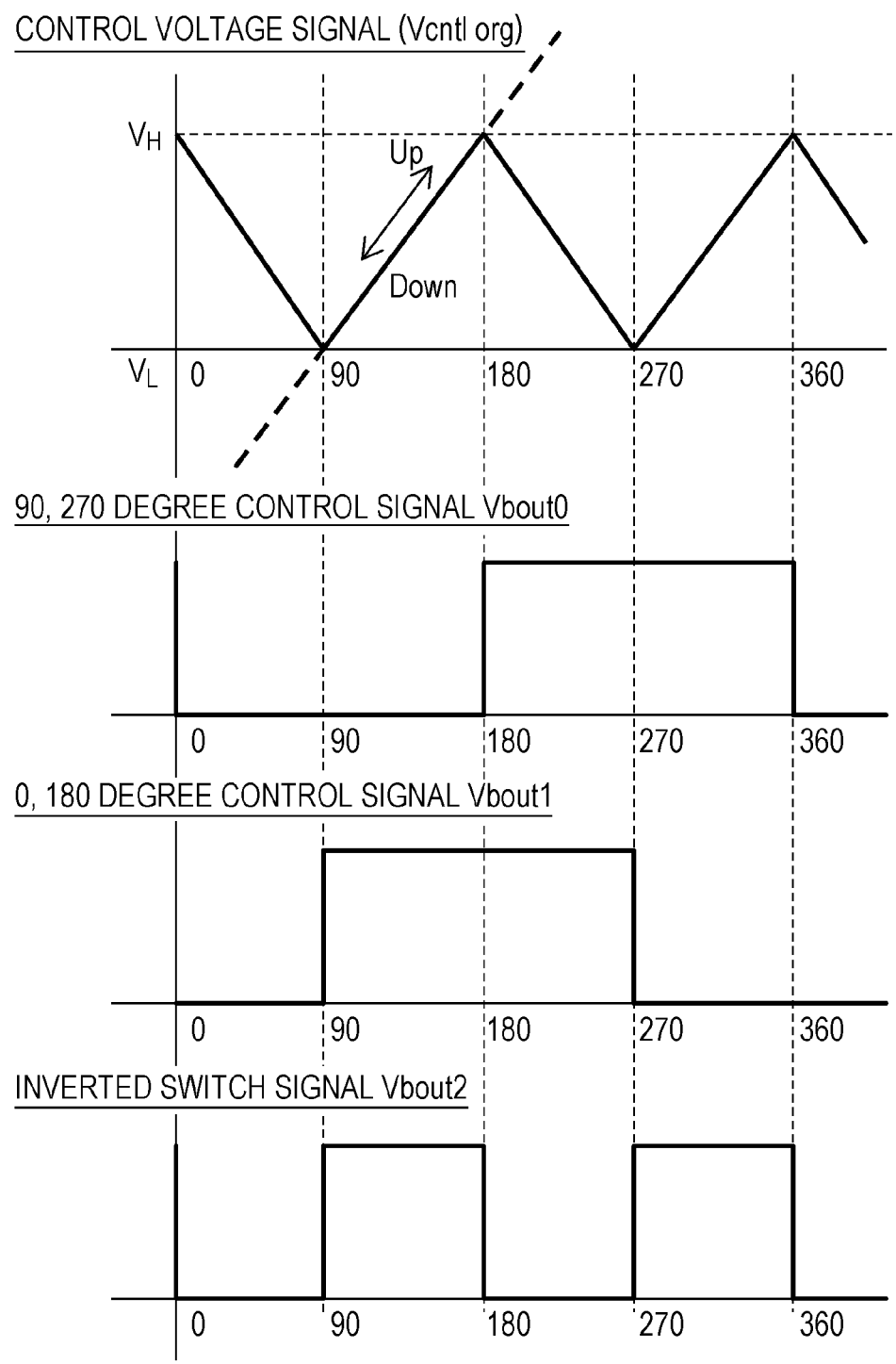
FIG. 6 is a timing chart illustrating changes of a control voltage signal, a 0 and 180 degree control signal, a 90 and 270 degree control signal, and an inverted switch signal, according to the first embodiment.

FIG. 6 is a timing chart illustrating changes of the control voltage signal Vcntl org, the 90 and 270 degree control signal Vbout0, the 0 and 180 degree control signal Vbout1, and the inverted switch signal Vbout2, according to the first embodiment.

Figure 7A:
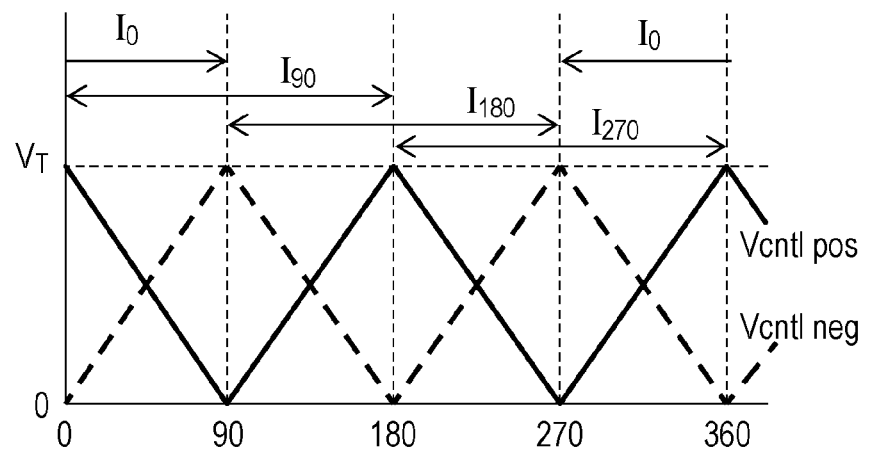
FIGS. 7A to 7C are timing charts illustrating changes of a two phase differential signal and a phase control signal according to the first embodiment.
Figure 7B:
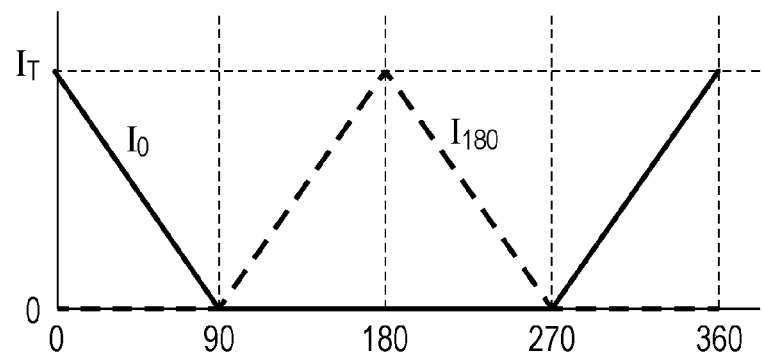
Figure 7C:
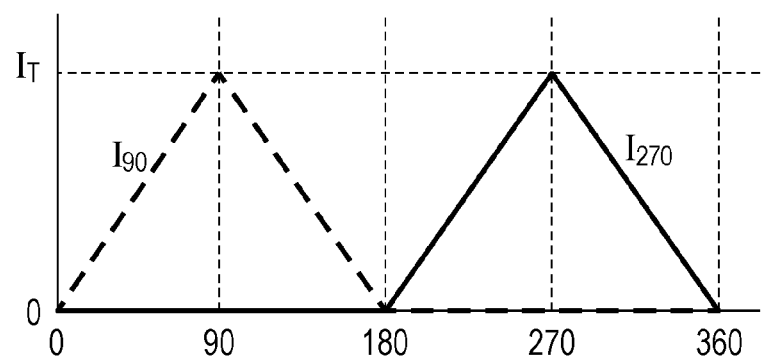

FIG. 7 is a timing chart illustrating changes of the two phase differential signals Vcntl pos and Vcntl neg, and the phase control signals $I_0$, $I_{90}$, $I_{180}$, and $I_{270}$, which are output from the synthesized phase selection circuit 29, according to the first embodiment. Signals which are used for control according to the first embodiment will be described with reference to FIGS. 5 to 7C.

As illustrated in a first row of FIG. 5, when the phase difference is changed between 0 degrees and 360 degrees, a range of 0 degrees to 360 degrees is divided by 90 degrees, and those are set as a first quadrant to a fourth quadrant in sequence. The control voltage signal Vcntl org is a signal which is inverted whenever the quadrant changes, that is, inverted for each 90 degrees, and which is changed in a linear fashion between a high level $V_H$ and a low level $V_L$. In FIG. 5, the control voltage signal Vcntl org reaches $V_H$ at 0 degrees of a start point of the first quadrant, $V_L$ at 90 degrees, $V_H$ at 180 degrees, and $V_L$ at 270 degrees. The control voltage signal Vcntl org moves in a right hand side of FIG. 5 when the phase difference increases, moves in a left hand side of FIG. 5 when the phase difference decreases, and changes the value depending on the phase.

As illustrated in a second row of FIG. 5, the 0 and 180 degree detection signal Vb0 is a short pulse signal which is generated when the signal Vcntl org reaches $V_H$ at 0 degrees and 180 degrees. As illustrated in a third row of FIG. 5, the 90 and 270 degree detection signal Vb1 is a short pulse signal which is generated when the signal Vcntl org reaches $V_L$ at 90 degrees and 270 degrees. As illustrated in a fourth row of FIG. 5, the 0, 90, 180 and 270 degree detection signal Vb2 is a signal which is obtained by combining the 0 and 180 degree detection signal Vb0 and the 90 and 270 degree detection signal Vb1. The 0, 90, 180 and 270 degree detection signal Vb2 is a short pulse signal which is generated when the signal Vcntl org reaches $V_H$ and $V_L$ at 0 degrees, 90 degrees, 180 degrees, and 270 degrees.

As illustrated in a second row of FIG. 6, the 90 and 270 degree control signal Vbout0 is a signal which is alternately changed to $V_L$ and $V_H$ whenever the signal Vb0 rises. The signal Vbout0 reaches $V_L$ between 0 degrees and 180 degrees (first and second quadrants), and reaches $V_H$ between 180 degrees and 360 degrees (third and fourth quadrants).

As illustrated in a third row of FIG. 6, the 0 and 180 degree control signal Vbout1 is a signal which is alternately changed to $V_L$ and $V_H$ whenever the signal Vb1 rises. The signal Vbout1 reaches $V_L$ between 0 degrees and 90 degrees and between 270 degrees and 360 degrees (first and fourth quadrants), and reaches $V_H$ between 90 degrees and 270 degrees (second and third quadrants).

As illustrated in a fourth row of FIG. 6, the inverted switch signal Vbout2 is a signal which is obtained by an exclusive OR operation of the signals Vbout0 and Vbout1. The signal Vbout2 is a signal which is switched to H and L for each quadrant, and reaches $V_L$ between 0 degrees and 90 degrees and between 180 degrees and 270 degrees (first and third quadrants), and reaches $V_H$ between 90 degrees and 180 degrees and between 270 degrees and 360 degrees (second and fourth quadrants).

It is possible to perform a high speed operation by generating control signals Vbout0, Vbout1 and Vbout2 for determining the four quadrants by the control voltage signal Vcnt org.

In FIG. 7A, a solid line illustrates one signal Vcntl pos of the two phase differential signals, and a dashed line illustrates the other signal Vcntl neg of the two phase differential signals. As illustrated in FIG. 7A, the one signal Vcntl pos of the two phase differential signals is the same signal as the signal Vcntl org, and the other signal Vcntl neg is an inverted signal of the signal Vcntl org.

In the phase interpolation, between 0 degrees and 90 degrees, a clock $\phi_0$ of a phase 0 degrees and a clock $\phi_{90}$ of a phase 90 degrees are synthesized. At this time, the weight of 00 is determined depending on the signal Vcntl pos, and the weight of $\phi_{90}$ is determined depending on the signal Vcntl neg. Between 90 degrees and 180 degrees, a clock $\phi_{90}$ of a phase 90 degrees and a clock $\phi_{180}$ of a phase 180 degrees are synthesized. At this time, the weight of $\phi_{90}$ is determined depending on the signal Vcntl neg, and the weight of $\phi_{180}$ is determined depending on the signal Vcntl pos. In the same manner, between 180 degrees and 270 degrees, the weight of $\phi_{180}$ is determined depending on the signal Vcntl pos, and the weight of $\phi_{270}$ is determined depending on the signal Vcntl neg. Between 270 degrees and 360 degrees, the weight of $\phi_{270}$ is determined depending on the signal Vcntl neg, and the weight of $\phi_0$ is determined depending on the signal Vcntl pos.

Thus, the signal Vcntl pos with a range from 270 degrees to 90 degrees can be used as a phase control signal $I_0$ of clock $\phi_0$, and the signal Vcntl neg with a range from 0 degrees to 180 degrees can be used as a phase control signal $I_{90}$ of clock $\phi_{90}$. In the same manner, the signal Vcntl pos with a range from 90 degrees to 270 degrees can be used as a phase control signal $I_{180}$ of clock 0180, and the signal Vcntl neg with a range from 180 degrees to 360 degrees can be used as a phase control signal $I_{270}$ of clock $\phi_{270}$.

FIG. 7B illustrates phase control signals $I_0$ and $I_{180}$, and FIG. 7C illustrates phase control signals $I_{90}$ and $I_{270}$. The phase control signal $I_0$ is the signal Vcntl pos at a range from 270 degrees to 90 degrees, and is a signal of zero at a range from 90 degrees to 270 degrees. As illustrated in the third row of FIG. 6, the signal Vbout1 reaches $V_L$ at a range from 270 degrees to 90 degrees, reaches $V_H$ at a range from 90 degrees to 270 degrees, an output of the signal Vcntl pos is controlled by the signal Vbout1, and thus, the phase control signal $I_0$ is generated. In the same manner, the phase control signal $I_{90}$ is the signal Vcntl neg at a range from 0 degrees to 180 degrees, and is a signal of zero at a range from 180 degrees to 360 degrees, an output of the signal Vcntl neg is controlled by the signal Vbout0, and thus, the phase control signal $I_{90}$ is generated. Further, the phase control signal $I_{180}$ is the signal Vcntl pos at a range from 90 degrees to 270 degrees, and is a signal of zero at a range from 270 degrees to 90 degrees, an output of the signal Vcntl pos is controlled by the signal Vbout1, and thus, the phase control signal $I_{180}$ is generated. Furthermore, the phase control signal $I_{270}$ is the signal Vcntl neg at a range from 0 degrees to 360 degrees, and is a signal of zero at a range from 0 degrees to 180 degrees, an output of the signal Vcntl neg is controlled by the signal Vbout0, and thus, the phase control signal $I_{270}$ is generated.

It is possible to control a current rate for controlling phases in the four quadrants by the control voltage signal Vcnt org. Accordingly, it is possible to perform a high speed operation than the technique of the Non-patent document 1 that controls phases by the two control signals which are generated by one control signal. In addition, it is possible to perform a high speed operation because both the control signals for the four quadrants (Vbout0, Vbout1, Vbout1) and the phase control signals ($I_0$, $I_{90}$, $I_{180}$, $I_{270}$) are directly controlled by the one control voltage signal, Vcnt org.

The synthesized phase selection circuit 29 outputs the phase control signals $I_0$, $I_{90}$, $I_{180}$ and $I_{270}$ which are changed like those illustrated in FIGS. 7B and 7C, according to the phase difference. The phase synthesis circuit 30 synthesizes the phase signals $\phi_0$, $\phi_{90}$, $\phi_{180}$ and $\phi_{270}$ of four phases based on the phase control signals $I_0$, $I_{90}$, $I_{180}$ and $I_{270}$, thereby generating the recovery clock.

Next, circuits and operations of each unit of the timing signal generation circuit according to the first embodiment will be described.

Figure 8:
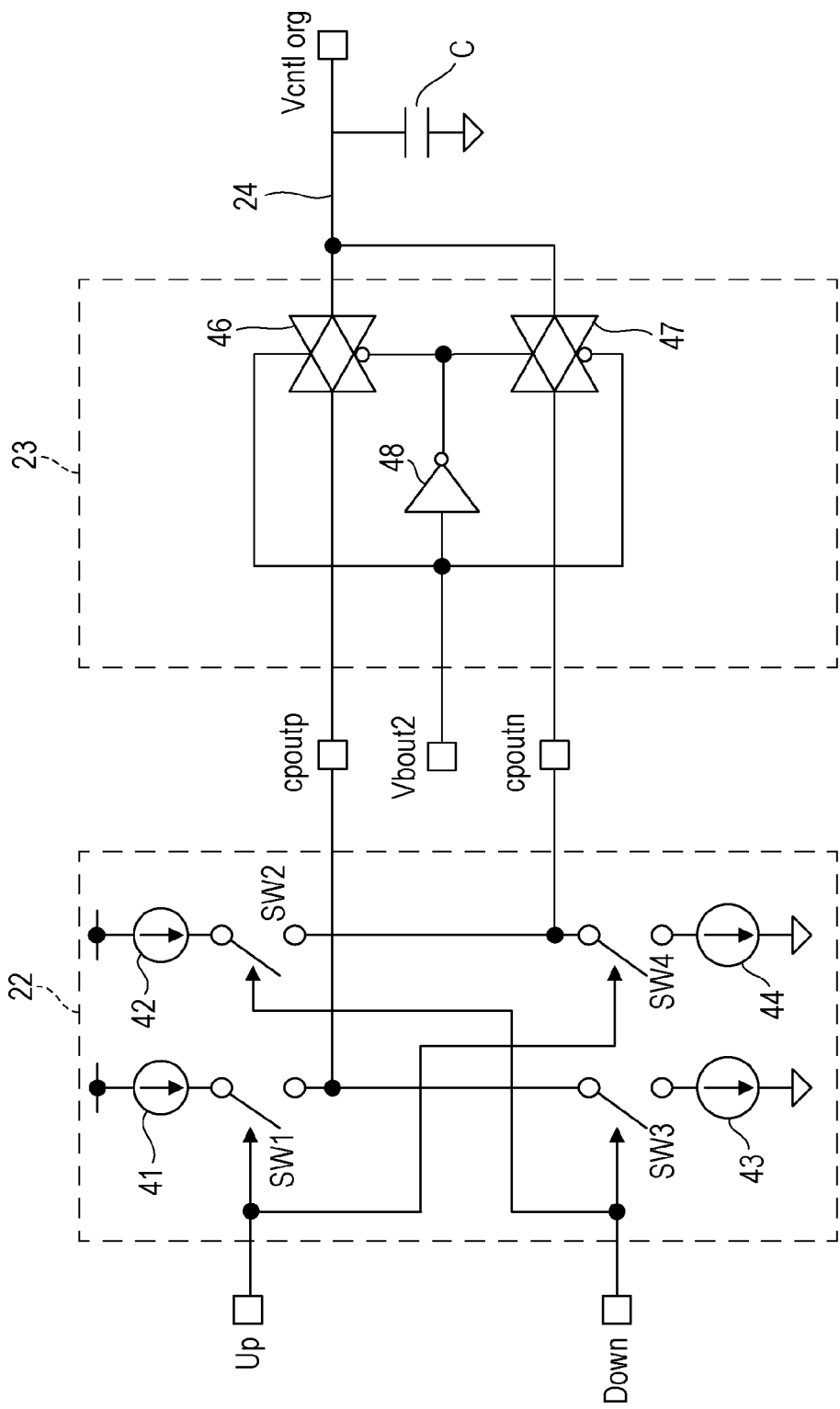
FIG. 8 is a diagram illustrating a circuit configuration of a control voltage signal generation unit including a charge pump and a loop filter.

FIG. 8 is a diagram illustrating a circuit configuration of the charge pump 22, the switch circuit 23, and the loop filter 24 which are included in the control voltage signal generation unit. The circuit including the charge pump 22, the switch circuit 23, and the loop filter 24 of the control voltage signal generation unit includes current sources 41 to 44, and switches SW1 to SW4. The switch circuit 23 includes gates 46 and 47 which switch a passing state, and an inverter 48. The loop filter 24 includes a capacitor C which is connected between an output terminal of the switch circuit 23 and the ground GND. The signal Vcntl org is output from a connection node of the output terminal of the switch circuit 23 and a first terminal of the capacitor C.

The operation of the circuit of the control voltage signal generation unit illustrated in FIG. 8 will be described. When the phase of the recovery clock lags with respect to the input data signal Data, the signal Up is input to the charge pump 22 from the phase comparison circuit 21, and when the phase of the recovery clock leads, the signal Down is input to the charge pump 22 from the phase comparison circuit 21. Since the phase comparison circuit 21 is well known, description thereof will be omitted.

When the signal Up is activated, the signal Down is deactivated, the switches SW1 and SW4 are switched on, and the switches SW2 and SW3 are switched off. At the time of the first or third quadrant, the signal Vbout2 reaches a low (L) level, the gate 46 turns on, and the gate 47 turns off. Thus, a current flow into the capacitor C via the current source 41, the switch SW1 and the gate 46, and the signal Vcntl org at the first terminal of the capacitor C rises at a uniform speed.

If the signal Vcntl org reaches a high level $V_H$, the signal Vbout2 changes to a high (H) level, the gate 46 turns off, and the gate 47 turns on. As a result, a current flow into the current source 44 from the first terminal of the capacitor C via the gate 47 and the switch SW4, and the signal Vcntl org at the first terminal of the capacitor C falls at a uniform speed. If the signal Vcntl org reaches a low level $V_L$, the signal Vbout2 changes to a low level. Hereinafter, the above-described operations are repeated, and thereby a signal changing in an upward direction according to the signal Vcntl org in the first rows of FIGS. 5 and 6 is output.

When the signal Up is deactivated, the signal Down is activated, the switches SW1 and SW4 are switched off, the switches SW2 and SW3 are switched on, and a signal changing in a downward direction according to the signal Vcntl org in the first rows of FIGS. 5 and 6 is output.

Figure 9A:
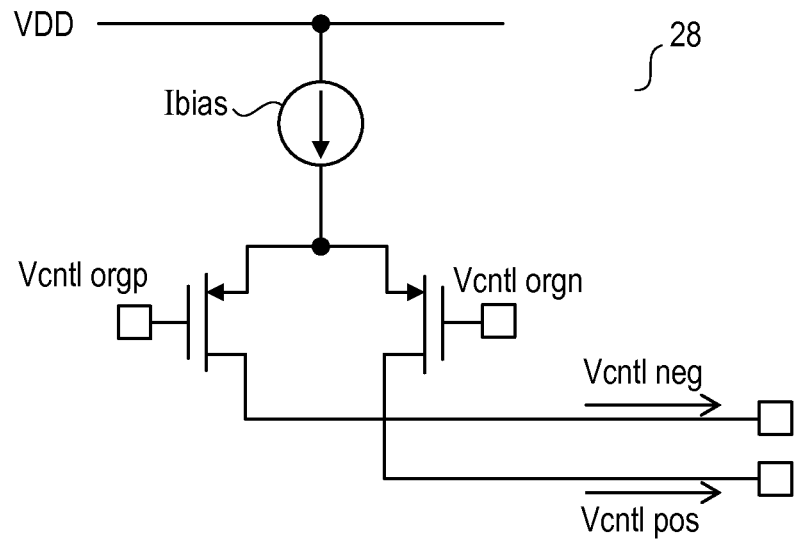
FIGS. 9A and 9B are diagrams illustrating configuration examples of a two phase differential signal generation circuit.
Figure 9B:
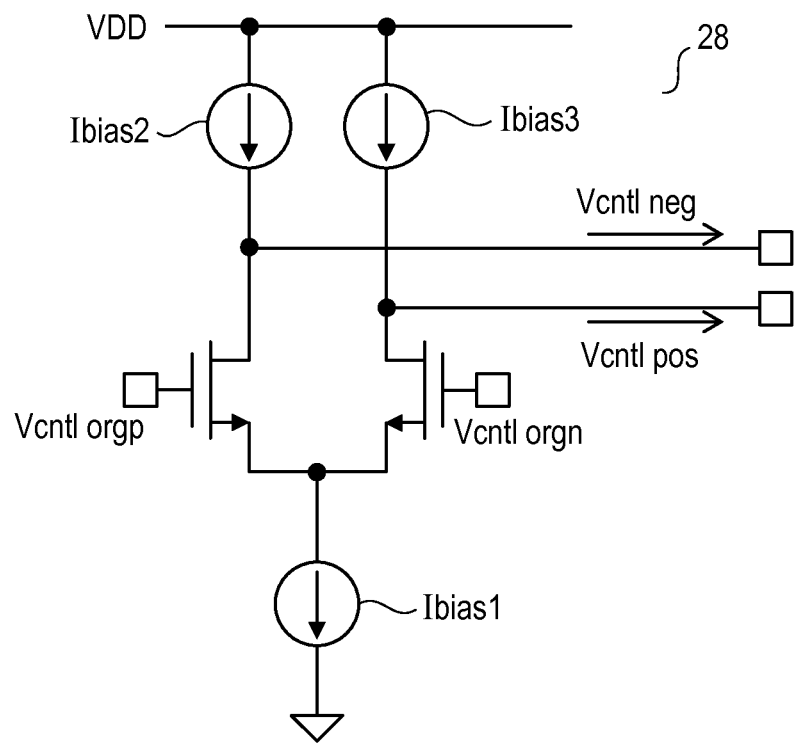

FIGS. 9A and 9B are diagrams illustrating configuration examples of the two phase differential signal generation circuit 28, FIG. 9A illustrates an example including a differential bias current source using a p type transistor, and FIG. 9B illustrates an example including a differential bias current source using an n type transistor.

The two phase differential signal generation circuit 28 of FIG. 9A is a circuit in which sources of two p type transistors which configure a differential pair are connected to a current source Ibias connected to a power supply VDD. Differential signals Vcntl orgp and Vcntl orgn of the signal Vcntl org are applied to gates of the two p type transistors, and the two phase differential signals Vcntl pos and Vcntl neg are output from drains of the two p type transistors.

The two phase differential signal generation circuit 28 of FIG. 9B is a circuit in which sources of the two n type transistors which configure differential pair are connected to a current source Ibias1 connected to the ground GND, and drains of the two n type transistors are respectively connected to the power supply VDD. The differential signals Vcntl orgp and Vcntl orgn of the signal Vcntl org are applied to gates of the two n type transistors, and the two phase differential signals Vcntl pos and Vcntl neg are output from drains of the two n type transistors.

The two phase differential signal generation circuits 28 of FIGS. 9A and 9B are circuits which distribute the currents of constant current sources according to the differential control signals Vcntl orgp and Vcntl orgn. The currents flowing through the transistors are controlled in an analog manner by the signals Vcntl orgp and Vcntl orgn, and the sum of the two phase differential signals Vcntl pos and Vcntl neg which are currents generated in the transistors is uniform. In addition, when the two phase differential signals Vcntl pos and Vcntol neg are supplied, one gate of the transistor can operate even with a DC voltage signal.

Then configurations illustrated in FIGS. 9A and 9B to provide the two phase differential signals Vcntl pos and Vcntl neg are suitable for performing a high speed operation, since the two phase differential signal generation circuits 28 distribute currents of uniform current sources according to the differential control signals Vcntl orgp and Vcntl orgn.

Figure 10A:
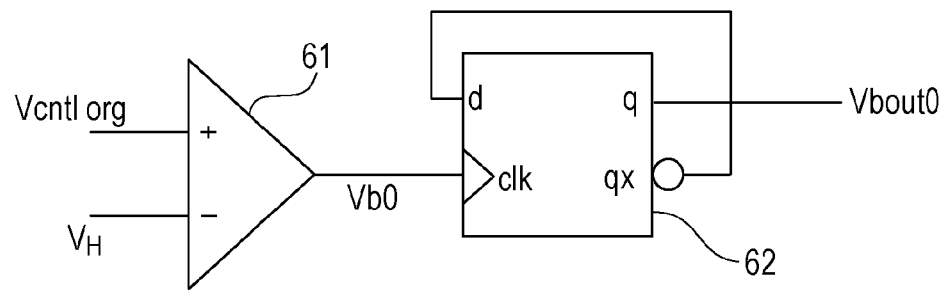
FIGS. 10A and 10B are diagrams illustrating a configuration and an operation of a 0 and 180 degree detection circuit.
Figure 10B:
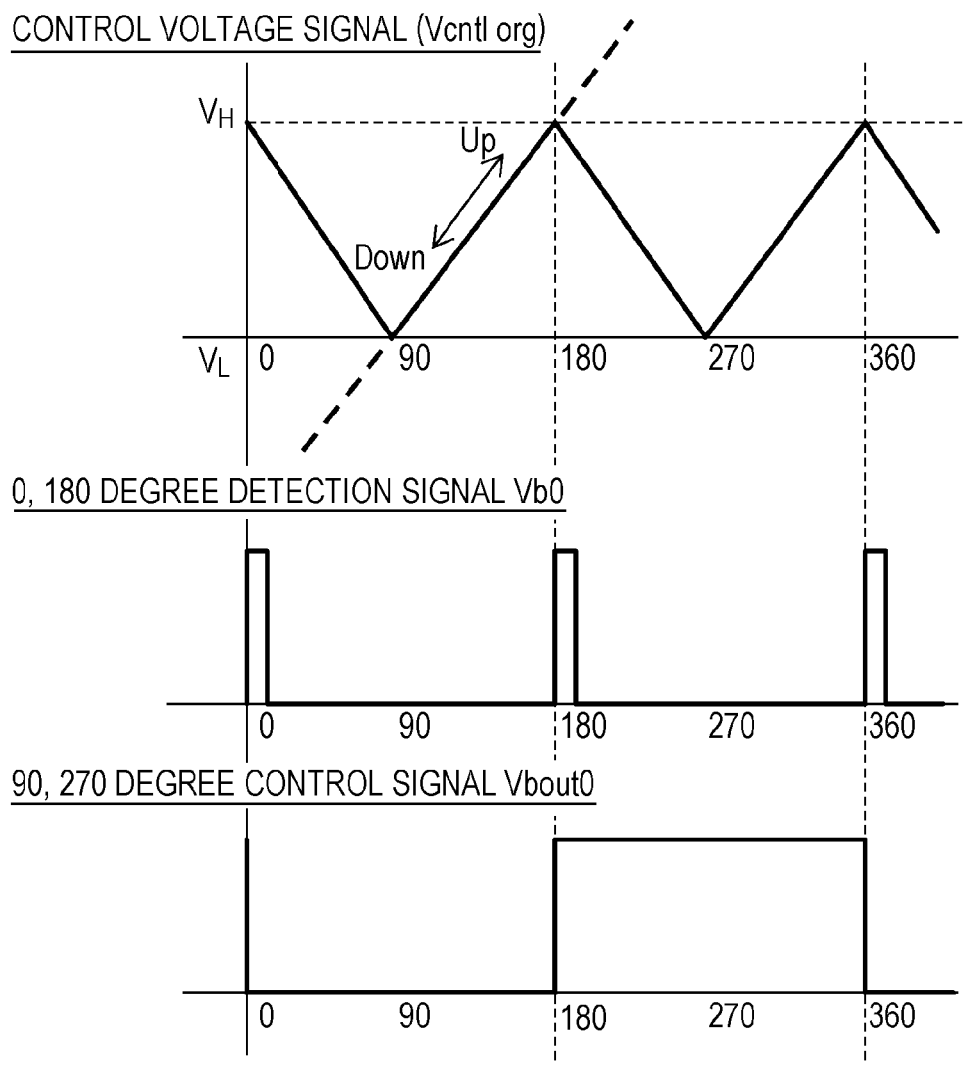

FIGS. 10A and 10B are diagrams illustrating a configuration and an operation of the 0 and 180 degree detection circuit 25, FIG. 10A illustrates the circuit configuration, and FIG. 10B illustrates a timing chart of the operation.

The 0 and 180 degree detection circuit 25 includes a comparison circuit 61 and a D type flip-flop (D-FF) 62. The comparison circuit 61 compares the signal Vcntl org with a high level threshold $V_H$, and outputs the compared result as the signal Vb0. The signal Vb0 is output as H when the signal Vcntl org is higher than the high level threshold $V_H$, and is output as L when the signal Vcntl org is lower than the high level threshold $V_H$. when the signal Vcntl org exceeds the high level threshold $V_H$, the signal Vb0 changes to H, but the switch circuit 23 is switched according to that, the signal Vcntl org decreases, and thereby, the signal Vb0 immediately returns back to L. Thus, the signal Vb0 becomes a pulse which is generated at 0 degrees and 180 degrees.

The D-FF 62 is a two frequency dividing circuit of the signal Vb0, and outputs the 90 and 270 degree control signal Vbout0 which alternately changes between L and H each time the pulse of the signal Vb0 is generated. In FIG. 10B, the signal Vbout0 is output as L between 0 degrees and 180 degrees (first and second quadrants), and is output as H between 180 degrees and 360 degrees (third and fourth quadrants).

The 90 and 270 degree detection circuit 26 has a similar configuration to the 0 and 180 degree detection circuit 25, and is the same as the 0 and 180 degree detection circuit 25 except that the signal Vcntl org is compared with a low level threshold $V_L$. The signal Vb1 becomes a pulse which is generated at 90 degrees and 270 degrees, and the signal Vbout1 is output as H between 90 degrees and 270 degrees (second and third quadrants), and is output as L between 270 degrees and 360 degrees, and between 0 degrees and 90 degrees (fourth and first quadrants).

Figure 11A:
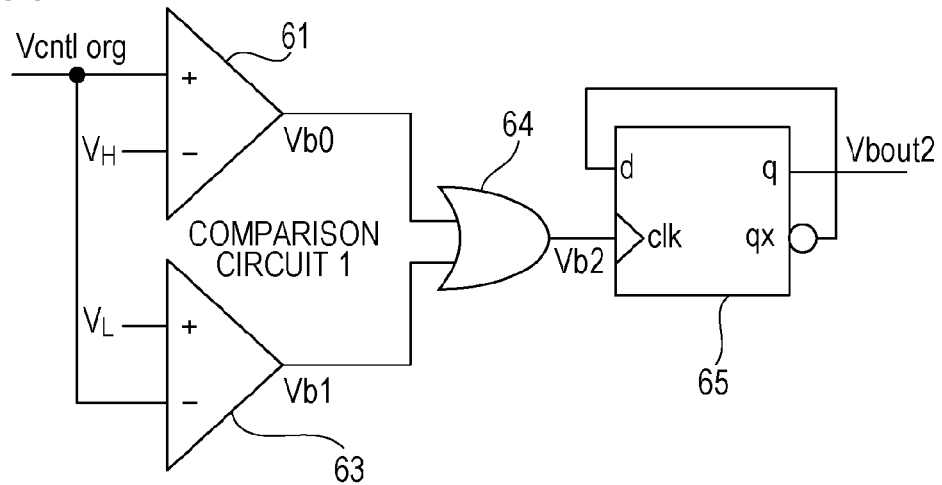
FIGS. 11A and 11B are diagrams illustrating a configuration and an operation of a 0, 90, 180 and 270 degree detection circuit.
Figure 11B:
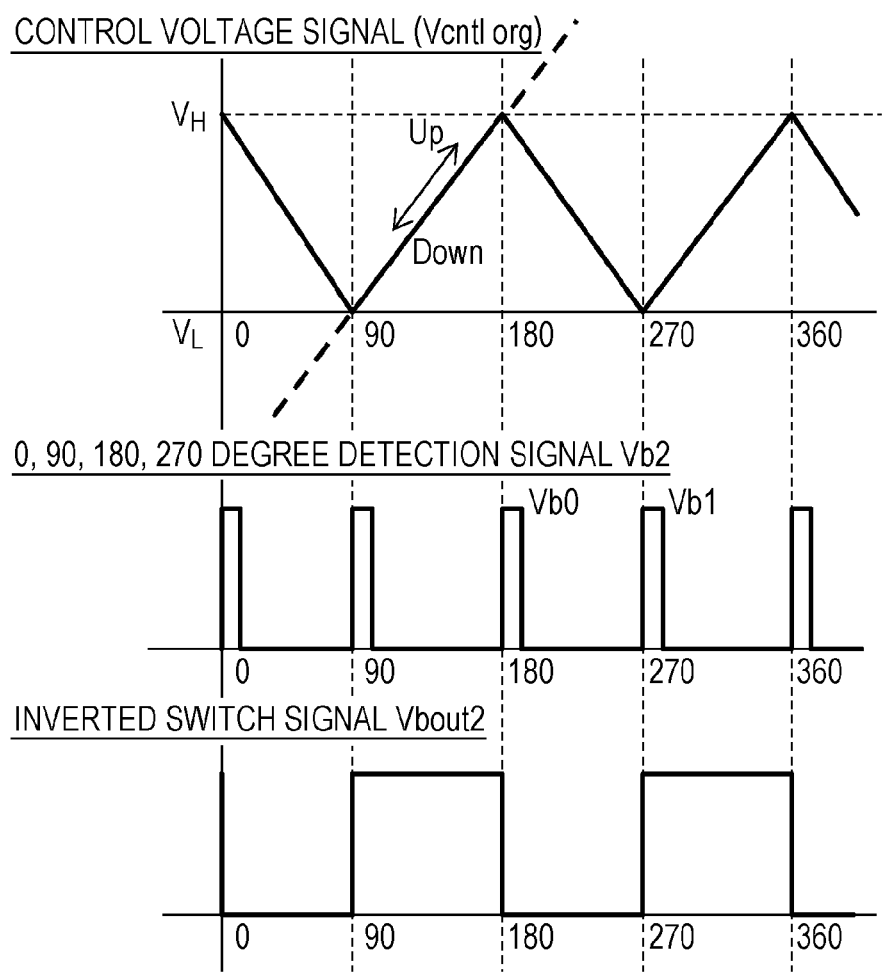

FIGS. 11A and 11B are diagrams illustrating a configuration and an operation of the 0, 90, 180 and 270 degree detection circuit 27, FIG. 11A illustrates the circuit configuration, and FIG. 11B illustrates a timing chart of the operation. In addition, FIG. 11A illustrates a circuit in which a comparison circuit 61 of the 0 and 180 degree detection circuit 25 and a comparison circuit 63 of the 90 and 270 degree detection circuit 26 are combined.

The 0, 90, 180 and 270 degree detection circuit 27 includes an OR gate 64 and a D-FF 65. The OR gate 64 calculates a logical sum of the signal Vb0 output from the comparison circuit 61 and the signal Vb1 output from the comparison circuit 63, and outputs the 0, 90, 180 and 270 degree detection signal Vb2. Thus, the signal Vb2 is a signal in which the 0 and 180 degree detection signal Vb0 and the 90 and 270 degree detection signal Vb1 are combined, and is a short pulse which is generated at 0 degrees, 90 degrees, 180 degrees and 270 degrees. The D-FF 65 is a two frequency dividing circuit of the signal Vb2, and outputs the inverted switch signal Vbout2 which alternately changes between L and H each time the pulse of the signal Vb2 is generated. In FIG. 11B, the signal Vbout2 is output as L between 0 degrees and 90 degrees (first quadrant), output as H between 90 degrees and 180 degrees (second quadrant), output as L between 180 degrees and 270 degrees (third quadrant), and output as H between 270 degrees and 360 degrees (fourth quadrant).

Figure 12A:
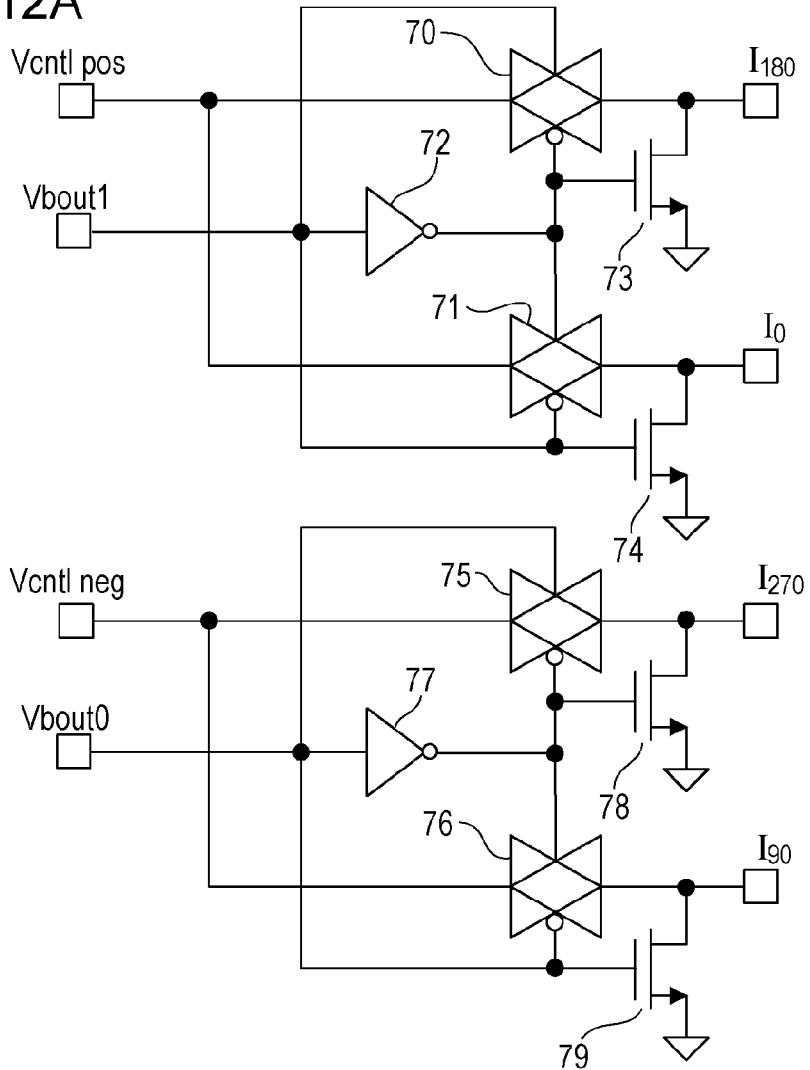
FIGS. 12A and 12B are diagrams illustrating circuit configurations of a synthesized phase selection circuit and a phase synthesis circuit.
Figure 12B:
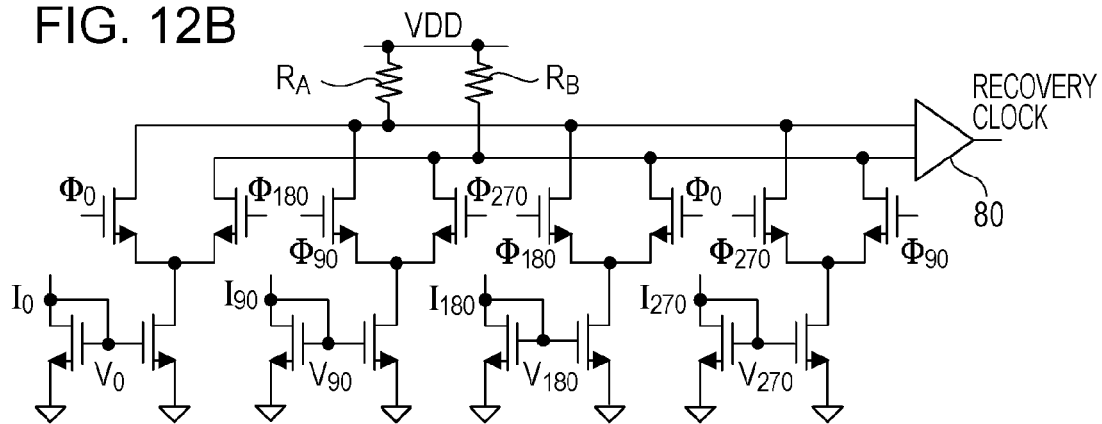

FIGS. 12A and 12B are diagrams illustrating circuit configurations of the synthesized phase selection circuit 29 and the phase synthesis circuit 30, FIG. 12A illustrates the circuit configuration of the synthesized phase selection circuit 29, and FIG. 12B illustrates the circuit configuration of the phase synthesis circuit 30.

The synthesized phase selection circuit 29 includes an unit for the signals $I_0$ and $I_{180}$, and an unit for the signals $I_{90}$ and $I_{270}$. The unit for the signals $I_0$ and $I_{180}$ includes gates 70 and 71 which switch a passing state, an inverter 72, an n type transistor 73 connected between the gate 70 and the ground GND, and an n type transistor 74 connected between the gate 71 and the ground GND. The signal Vcntl pos is input to the gates 70 and 71, and a passing state is controlled by the signal Vbout1. The output of the gate 70 is connected to a terminal which outputs the signal $I_{180}$, and the output of the gate 71 is connected to a terminal which outputs the signal $I_0$. The n type transistor 73 functions as a switch, and is turned on or off by a signal which is obtained by inverting the signal Vbout1 using the inverter 72. When the n type transistor 73 turns on, a terminal which outputs the signal $I_{180}$ is grounded. The n type transistor 74 functions as a switch, and is turned on or off by the signal Vbout1. When the n type transistor 74 turns on, a terminal which outputs the signal $I_0$ is grounded.

Specifically, the gate 70 enters a passing state at the second and third quadrants in which the signal Vbout1 reaches H, and at this time, the n type transistor 73 turns off. The gate 70 enters a blocking state at the first and fourth quadrants in which the signal Vbout1 reaches L, and at this time, the n type transistor 73 turns on. Thus, the signal $I_{180}$ becomes the signal illustrated in FIG. 7B.

In the same manner, the gate 71 enters a passing state at the first and fourth quadrants in which the signal Vbout1 reaches L, and at this time, the n type transistor 74 turns off. The gate 71 enters a blocking state at the second and third quadrants in which the signal Vbout1 reaches H, and at this time, the n type transistor 74 turns on. Thus, the signal $I_0$ becomes the signal illustrated in FIG. 7B.

In the same manner as the unit for the signals $I_0$ and $I_{180}$, the unit for the signals $I_{90}$ and $I_{270}$ includes gates 75 and 76, an inverter 77, an n type transistor 78, and an n type transistor 79. In the same manner as that described above, the signal $I_{270}$ which is output from a terminal connected to the gate 75 becomes the signal illustrated in FIG. 7C, and the signal $I_{90}$ which is output from a terminal connected to the gate 76 becomes the signal illustrated in FIG. 7C.

As described above, the synthesized phase selection circuit 29 outputs the phase control signals $I_0$, $I_{90}$, $I_{180}$ and $I_{270}$ which are illustrated in FIGS. 7B and 7C.

As illustrated in FIG. 12B, the phase synthesis circuit 30 includes two load resistors $R_A$ and $R_B$ which are connected to the power supply VDD, four differential pairs which are connected to the resistors $R_A$ and $R_B$, and a differential amplifier 80, inputs of which are connected to connection nodes of the resistors $R_A$ and $R_B$, and the four differential pairs. The recovery clock is output from the differential amplifier 80. The differential signals of the clocks $\phi_0$, $\phi_{90}$, $\phi_{180}$, and $\phi_{270}$ of four phases which are used for synthesis are respectively applied to the n type transistors which form the four differential pairs. Current sources of the four differential pairs are formed by four current mirrors, an amount of current of which is controlled by the phase control signals $I_0$, $I_{90}$, $I_{180}$ and $I_{270}$. Gate voltages of the transistors of a current mirror circuit are represented by $V_0$, $V_{90}$, $V_{180}$ and $V_{270}$.

According to the configuration of the phase synthesis circuit 30 in FIG. 12B, the synthesis of the clocks $\phi_0$, $\phi_{90}$, $\phi_{180}$, and $\phi_{270}$ of four phases is performed based on the phase control signals $I_0$, $I_{90}$, $I_{180}$ and $I_{270}$ which are output from the synthesized phase selection circuit 29.

As described above, in the timing signal generation circuit according to the first embodiment, the recovery clock resulting from the CDR is generated, just by adding a simple logical calculation to an analog signal processing.

Hereinafter, the result of performing an operation simulation at the time of continuously changing a phase, with respect to the timing signal generation circuit according to the first embodiment will be described.

FIG. 13 is a diagram illustrating simulation results of the control voltage signal Vcntl org, the 0 and 180 degree detection signal Vb0, the 90 and 270 degree detection signal Vb1, and the 0, 90, 180 and 270 degree detection signal Vb2. According to FIG. 13, it can be seen that the signals illustrated in FIG. 5 are obtained.

Figure 14:
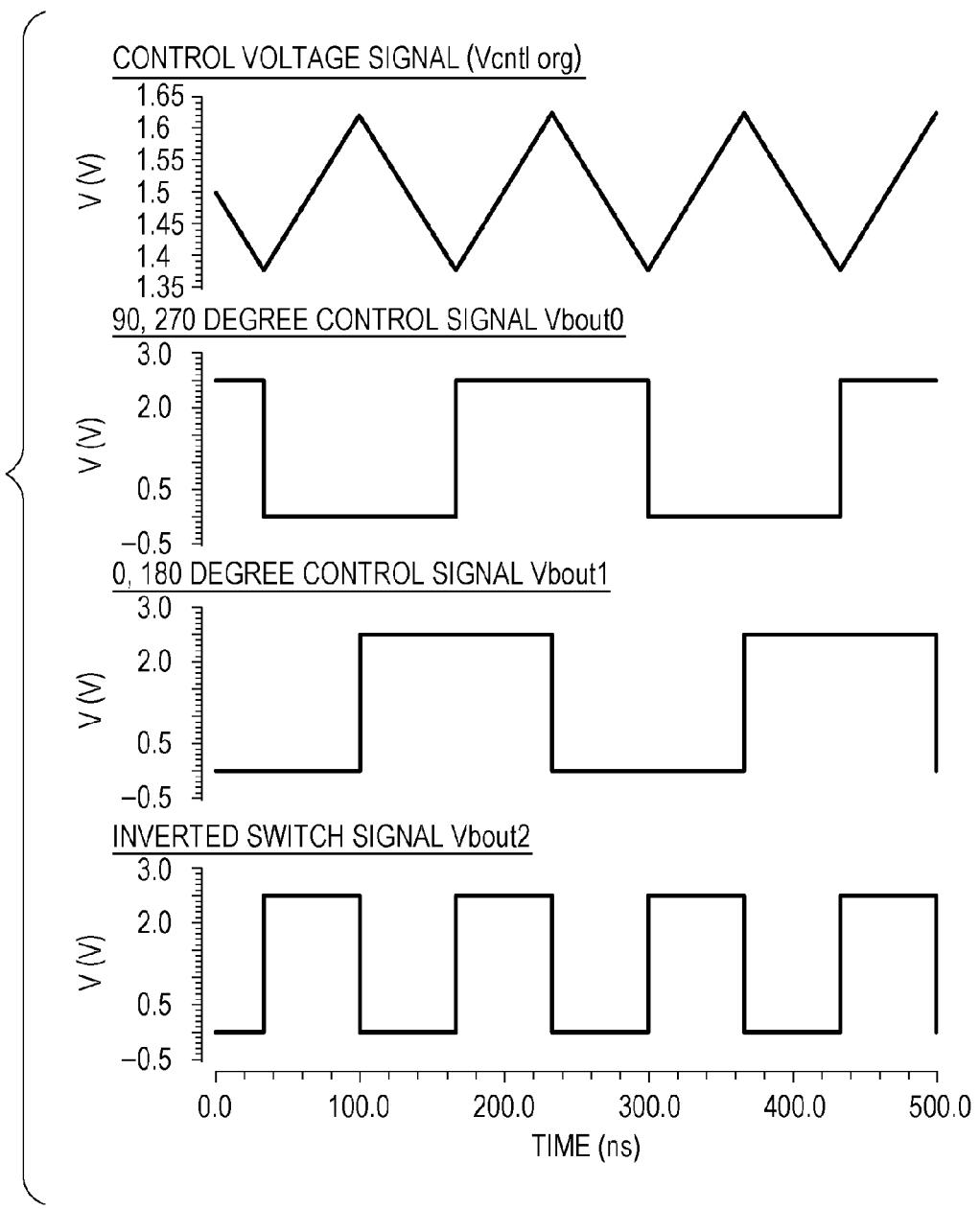
FIG. 14 is a diagram illustrating simulation results of a control voltage signal, a 0 and 180 degree control signal, a 90 and 270 degree control signal, and an inverted switch signal.

FIG. 14 is a diagram illustrating simulation results of the control voltage signal Vcntl org, the 90 and 270 degree control signal Vbout0, the 0 and 180 degree control signal Vbout1, and the inverted switch signal Vbout2. According to FIG. 14, it can be seen that the signals illustrated in FIG. 6 are obtained.

Figure 15:
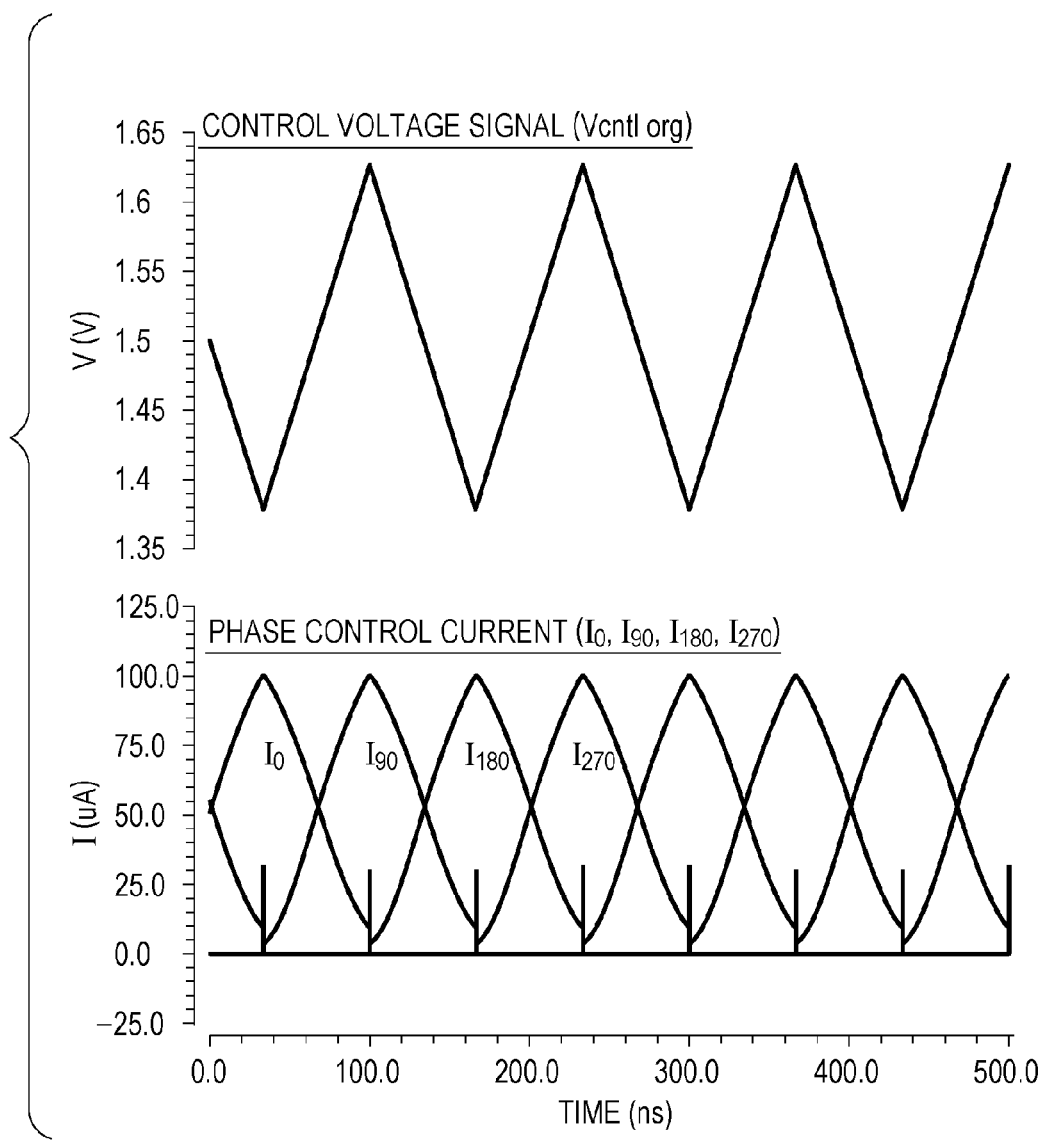
FIG. 15 is a diagram illustrating simulation results of a control voltage signal, and phase control signals of clocks of four phases output from the synthesized phase selection circuit, when phase control is performed in a positive direction.

FIG. 15 is a diagram illustrating simulation results of the control voltage signal Vcntl org, and the phase control signals $I_0$, $I_{90}$, $I_{180}$ and $I_{270}$ of clocks of four phases output from the synthesized phase selection circuit 29, when a phase control is performed in a positive direction.

Figure 16:
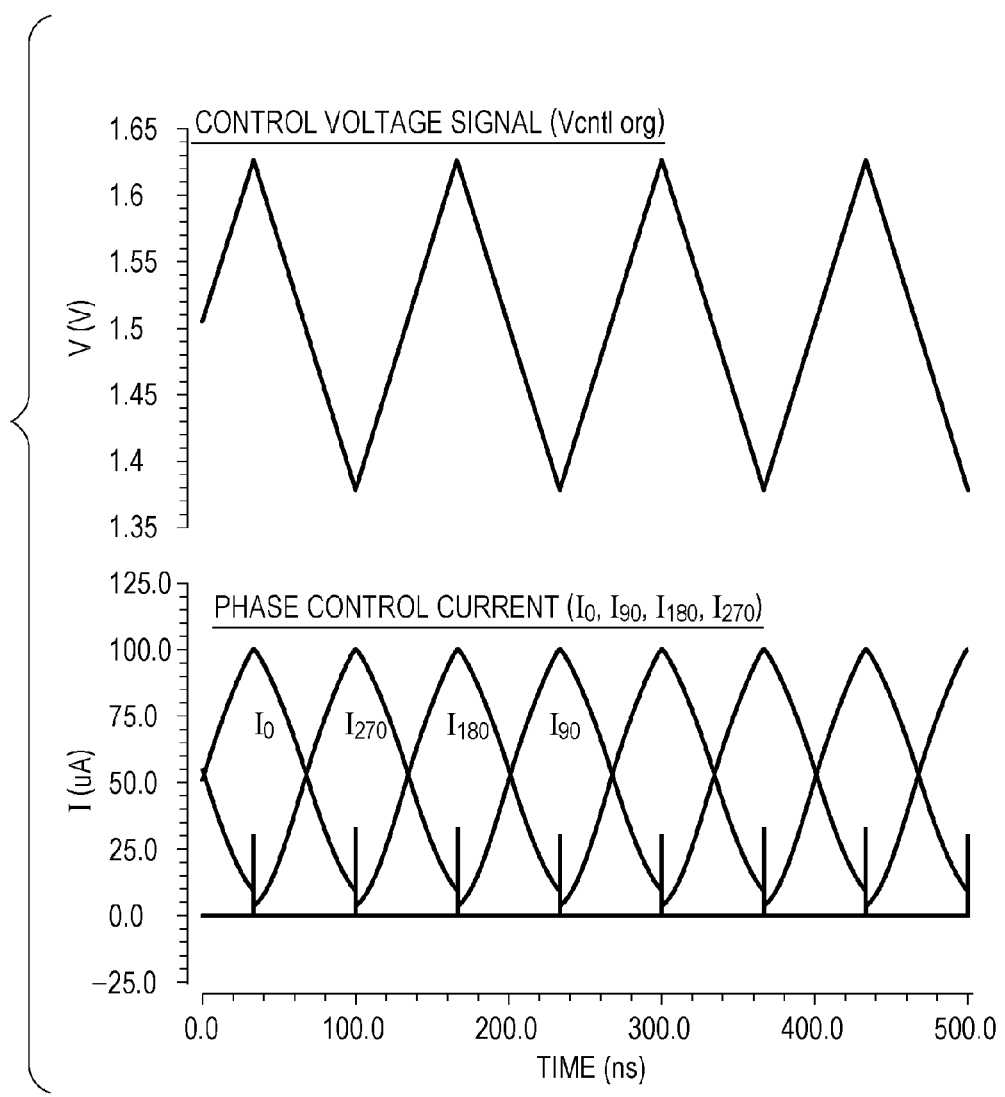
FIG. 16 is a diagram illustrating simulation results of a control voltage signal, and phase control signals of clocks of four phases output from the synthesized phase selection circuit, when phase control is performed in a negative direction.

FIG. 16 is a diagram illustrating simulation results of the control voltage signal Vcntl org, and phase control signals $I_0$, $I_{90}$, $I_{180}$ and $I_{270}$ of clocks of four phases output from the synthesized phase selection circuit 29, when a phase control is performed in a negative direction.

From FIGS. 15 and 16, it can be seen that the signals illustrated in FIGS. 7B and 7C are obtained.

In the first embodiment, a circuit portion which includes the charge pump 22, the switch circuit 23, and the loop filter 24 of the control voltage signal generation unit outputs the control voltage signal Vcntl org of a single phase. However, it is also possible to form such a circuit as a differential circuit, to generate differential control voltage signals, and to output the generated signals. In a timing signal generation circuit according to a second embodiment which is described hereinafter, a case where a control voltage signal generation unit is formed as a differential circuit is taken as an example.

Second Embodiment

Figure 17:
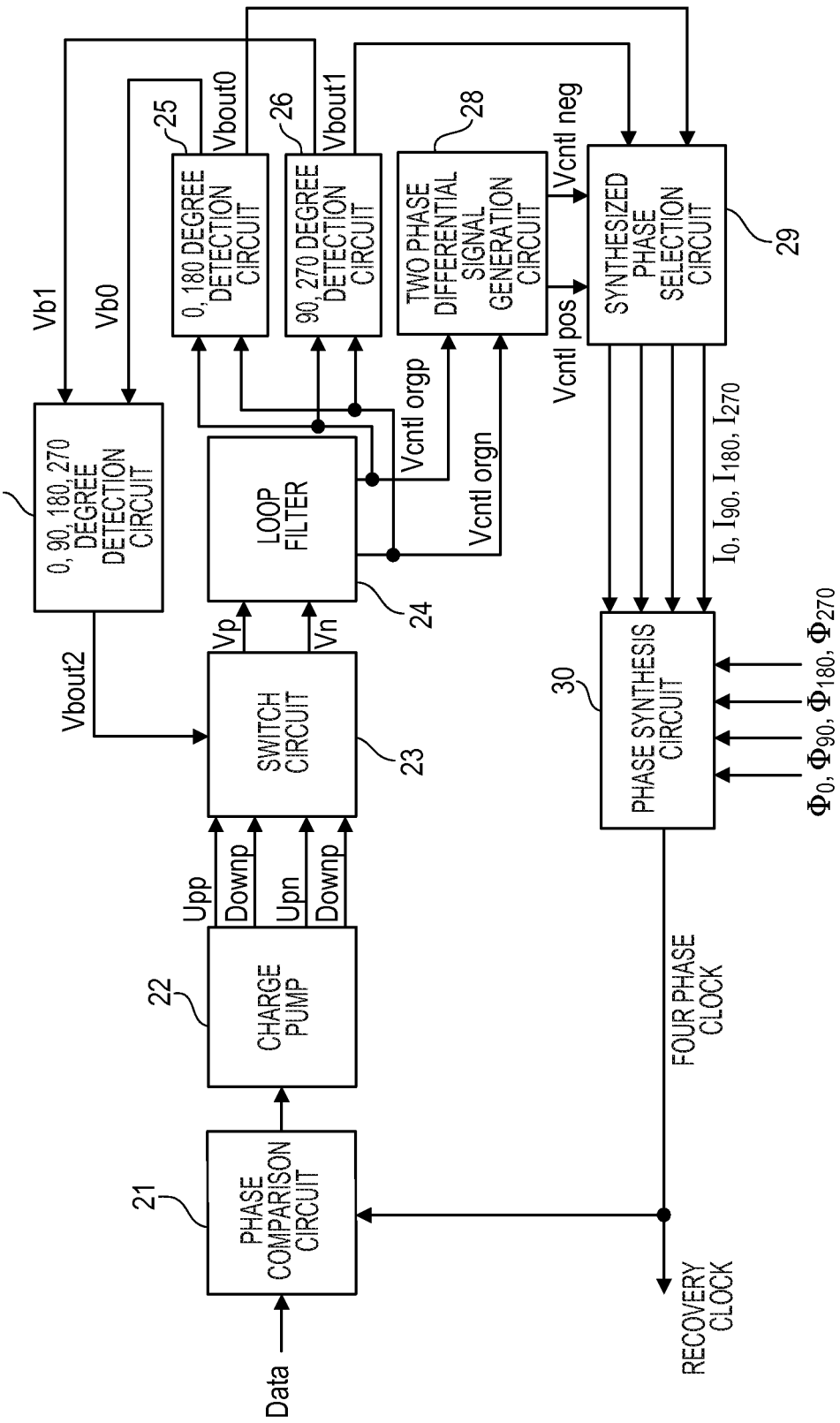
FIG. 17 is a diagram illustrating a configuration of a timing signal generation circuit according to a second embodiment.

FIG. 17 is a diagram illustrating a configuration of a timing signal generation circuit according to a second embodiment. The timing signal generation circuit according to the second embodiment includes the phase comparison circuit 21, the charge pump 22, the switch circuit 23, the loop filter 24, the 0 and 180 degree detection circuit 25, and the 90 and 270 degree detection circuit 26. The timing signal generation circuit according to the second embodiment further includes the 0, 90, 180 and 270 degree detection circuit 27, the two phase differential signal generation circuit 28, the synthesized phase selection circuit 29, and the phase synthesis circuit 30.

In the second embodiment, the charge pump 22, the switch circuit 23, the loop filter 24, the 0 and 180 degree detection circuit 25, the 90 and 270 degree detection circuit 26, the 0, 90, 180 and 270 degree detection circuit 27, and the two phase differential signal generation circuit 28 are all differential circuits. This is a different point from the first embodiment.

Particularly, the loop filter 24 outputs the differential control voltage signals Vcntl orgp and Vcntl orgn to the 0 and 180 degree detection circuit 25, the 90 and 270 degree detection circuit 26, and the two phase differential signal generation circuit 28. Due to this, the two phase differential signal generation circuit 28 can also generate the two phase differential signals Vcntl pos and Vcntl neg from the signals Vcntl orgp and Vcntl orgn. If the signals Vcntl orgp and Vcntl orgn are used as they are, as the two phase differential signals Vcntl pos and Vcntl neg, the two phase differential signal generation circuit 28 may be removed. As a result, further high speed operation can be realized. Furthermore, the 0 and 180 degree detection circuit 25 and the 90 and 270 degree detection circuit 26 generate timing signals using the signals Vcntl orgp and Vcntl orgn.

Figure 18:
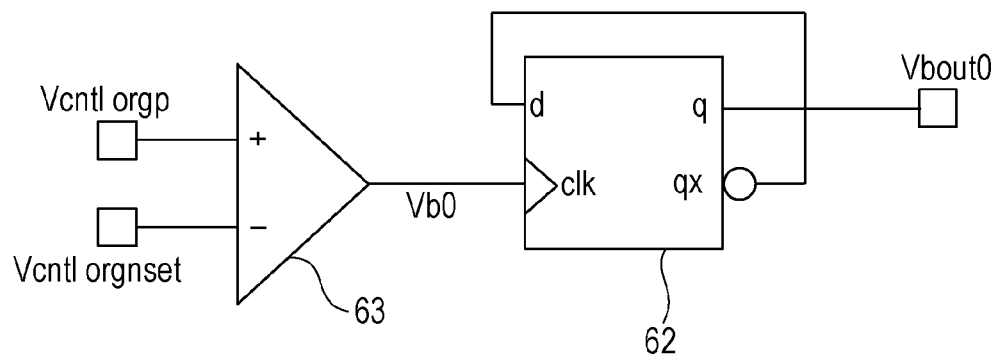
FIG. 18 is a diagram illustrating a configuration of a 0 and 180 degree detection circuit of the timing signal generation circuit according to the second embodiment.

FIG. 18 is a diagram illustrating the configuration of the 0 and 180 degree detection circuit 25 of the timing signal generation circuit according to the second embodiment. FIG. 19 is a timing chart illustrating the operation of the 0 and 180 degree detection circuit 25 and the 90 and 270 degree detection circuit 26 according to the second embodiment.

In the first embodiment, the 0 and 180 degree detection circuit 25 and the 90 and 270 degree detection circuit 26 receive the control voltage signal Vcntl org from the loop filter 24, and generate the signals Vb0, Vb1, Vbout0 and Vbout1. In contrast to this, the 0 and 180 degree detection circuit 25 and the 90 and 270 degree detection circuit 26 according to the second embodiment receive the signals Vcntl orgp and Vcntl orgn.

As illustrated in FIG. 18, the 0 and 180 degree detection circuit 25 includes the comparison circuit 63 and the D-FF 62. The D-FF 62 is the same as that of the first embodiment. The comparison circuit 63 detects that the signal Vcntl orgp exceeds a signal Vcntl orgnset which is obtained by offsetting the signal Vcntl orgn to a high side. An offset amount of the signal Vcntl neg is a little less than $V_H - V_L$. The 90 and 270 degree detection circuit 26 has a similar configuration to the 0 and 180 degree detection circuit 25.

As illustrated in FIG. 19, the signals Vcntl orgp and Vcntl orgn are signals in reverse phase with each other. The signal Vcntl orgp exceeds the signal Vcntl orgnset which is obtained by shifting the signal Vcntl orgn to a high side by the above-described offset amount, near 0 degrees and 180 degrees. In the same manner as the first embodiment, the comparison circuit 63 outputs a short pulse Vb0, during a short time period in which the signal Vcntl orgp exceeds the signal Vcntl orgnset.

In the 90 and 270 degree detection circuit 26, the comparison circuit detects that the signal Vcntl orgn exceeds a signal Vcntl orgpset which is obtained by shifting the signal Vcntl orgp to a high side by the offset amount described above, near 90 degrees and 270 degrees, and outputs a short pulse Vb1.

The differential control voltage signals Vcntl orgp and Vcntl orgn controlled by the charge pump 22 may control Vbout0, Vbout1 and Vbout1 for determining the four quadrants by the control voltage signal Vcnt org and phase control signals $I_0$, $I_{90}$, $I_{180}$ and $I_{270}$. Accordingly, it is possible to perform a high speed operation, since it is unnecessary to control phases by the two control signals which are generated by one control signal indicated in the Non-patent document 1. In addition, it is possible to perform a high speed operation because both the control signals for the four quadrants (Vbout0, Vbout1, Vbout1) and the phase control signals ($I_0$, $I_{90}$, $I_{180}$, $I_{270}$) are directly controlled by the one set control voltage signal, Vcntl orgp and Vcntl orgn.

Third Embodiment

Figure 20A:
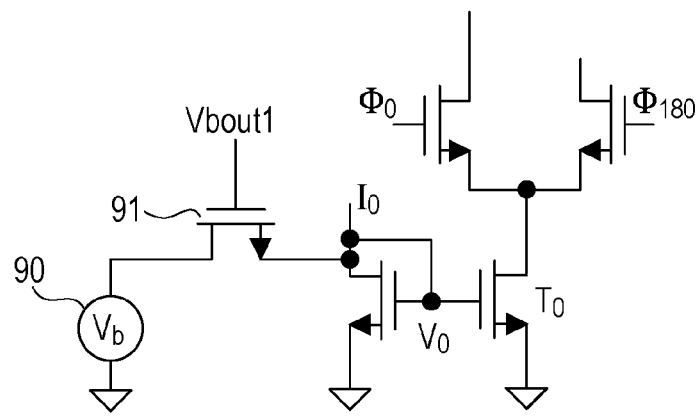
FIGS. 20A to 20C are diagrams illustrating a configuration and an operation of the portion of one differential pair of a phase synthesis circuit of a timing signal generation circuit according to a third embodiment.
Figure 20B:
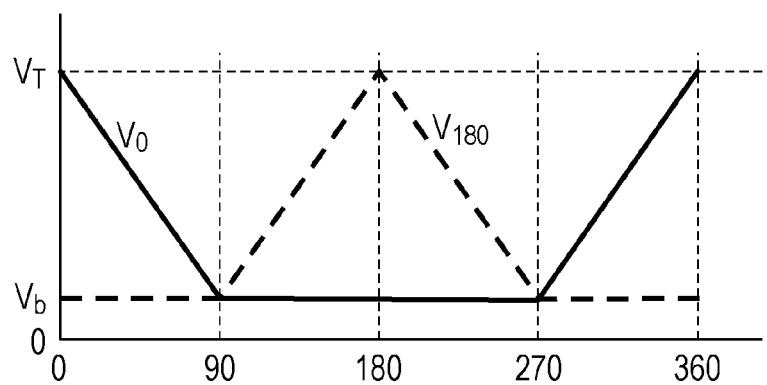
Figure 20C:
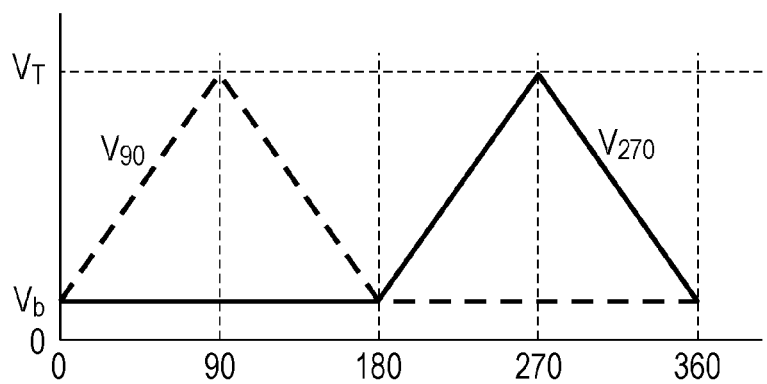

FIGS. 20A to 20C are diagrams illustrating a configuration and an operation of the portion of one differential pair of the phase synthesis circuits 30 of the timing signal generation circuit according to a third embodiment, FIG. 20A illustrates a circuit configuration of the portion of the one differential pair of the phase synthesis circuits 30, and FIGS. 20B and 20C illustrate the phase control signals $I_0$, $I_{90}$, $I_{180}$ and $I_{270}$.

In the timing signal generation circuit according to the third embodiment, only the phase synthesis circuit 30 is different from that of the first embodiment, and the other portions are the same as those of the first embodiment.

In the first embodiment, an amount of current of the current source configured with a current mirror circuit connected to multiple differential pairs of the phase synthesis circuit 30 is controlled by the phase control signals $I_0$, $I_{90}$, $I_{180}$ and $I_{270}$, and when the phase control signals $I_0$, $I_{90}$, $I_{180}$ and $I_{270}$ are zero, the current does not flow through the current source. In other words, the gate voltages $V_0$ of the transistors of the current mirror circuit configuring the current source is zero. In a case where a change is made from a state where the current does not flow to a state which is selected to synthesize, that is, a state where the current flows through the corresponding current source, the current actually flows when the voltage $V_0$ rises up to a threshold, and is delayed by the time in which the voltage $V_0$ rises from zero to a threshold.

In contrast to this, the third embodiment provides a voltage source 90 with a threshold voltage Vb, and a transistor 91 which operates in such a manner that the threshold voltage is applied to the gates of the transistors of the current mirror circuit, only when the phase control signals $I_0$, $I_{90}$, $I_{180}$ and $I_{270}$ are zero. Specifically, in a circuit of the signal $I_0$, the signal Vbout1 is applied to the gate of the transistor 91, in a circuit of the signal $I_{90}$, the signal Vbout0 is applied to the gate of the transistor 91, in a circuit of the signal $I_{180}$, an inverted signal of the signal Vbout1 is applied to the gate of the transistor 91, and in a circuit of the signal $I_{270}$, an inverted signal of the signal Vbout0 is applied to the gate of the transistor 91.

Thus, as illustrated in FIGS. 20B and 20C, when the phase control signals $I_0$, $I_{90}$, $I_{180}$ and $I_{270}$ are zero and are not selected (not used for synthesis), the gate voltage of the transistor 91 is the threshold voltage Vb, and if the voltage changes, the current immediately flows. As a result, in the third embodiment, it is possible to reduce the time in which the phase control signals $I_0$, $I_{90}$, $I_{180}$ and $I_{270}$ are switched from zero. In addition, if it is a method of biasing the gate voltage near the threshold voltage Vb, a method such as that a bias current is caused to flow may be adopted in addition to this configuration.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A timing signal generation circuit comprising:
    a phase comparison circuit configured to detect a phase difference between an input signal and a recovery clock;
    a control voltage signal generation unit configured to generate two phase differential control voltage signals which are inverted for each predetermined angle and which change between a high level and a low level of the control voltage signals, based on the detected phase difference;
    a timing detection circuit configured to detect timing in which the control voltage signals are inverted, and generate quadrant information of the phase difference of the control voltage signals and an inverted timing signal;
    a synthesized phase selection circuit configured to select clocks of two phases which are used for phase interpolation for each predetermined angle, from clocks of a plurality of phases, and generate a phase control signal for synthesizing the selected clocks of two phases for the phase interpolation, based on the control voltage signals and the quadrant information; and
    a phase synthesis circuit configured to generate the recovery clock by synthesizing the selected clocks of two phases, based on the phase control signal.

2. The timing signal generation circuit according to claim 1,
    wherein the clocks of the plurality of phases are clocks of four phases that are shifted by 90 degrees, and
    wherein the control voltage signals are inverted in response to a quadrant for each 90 degrees of the clocks of four phases.

3. The timing signal generation circuit according to claim 2,
    wherein the timing detection circuit includes:
    a 0 and 180 degree detection circuit configured to detect timing in which the control voltage signals are inverted at the high level or the low level, and generate a 0 and 180 degree detection signal and a 90 and 270 degree control signal; and
    a 90 and 270 degree detection circuit configured to detect timing in which the control voltage signals are inverted at the high level or the low level, and generate a 90 and 270 degree detection signal and a 0 and 180 degree control signal.

4. The timing signal generation circuit according to claim 3,
    wherein the 0 and 180 degree detection circuit includes:
    a high side comparison circuit configured to compare the control voltage signals with a high side threshold or a low side threshold, and generate the 0 and 180 degree detection signal, when the control voltage signals are greater than the high side threshold or smaller than the low side threshold; and
    a 90 and 270 degree control signal generation circuit configured to generate the 90 and 270 degree control signal according to the 0 and 180 degree detection signal, and
    wherein the 90 and 270 degree detection circuit includes:
    a low side comparison circuit configured to compare the control voltage signals with the high side threshold or the low side threshold, and generate the 90 and 270 degree detection signal, when the control voltage signals are greater than the high side threshold or smaller than the low side threshold; and
    a 0 and 180 degree control signal generation circuit configured to generate the 0 and 180 degree control signal according to the 90 and 270 degree detection signal.

5. The timing signal generation circuit according to claim 2,
    wherein the 0 and 180 degree detection circuit includes:
    a high side comparison circuit configured to compare one of the control voltage signals with a reverse phase offset control voltage signal which is obtained by applying an offset voltage to a reverse phase signal of the one of the control voltage signal, and generate the 0 and 180 degree detection signal, when the one of the control voltage signals exceeds the reverse phase offset control voltage signal; and
    a 90 and 270 degree control signal generation circuit configured to generate the 90 and 270 degree control signal according to the 0 and 180 degree detection signal, and
    wherein the 90 and 270 degree detection circuit includes:
    a low side comparison circuit configured to compare the reverse phase signal with an offset control voltage signal which is obtained by applying an offset voltage to the one of the control voltage signals, and generate the 90 and 270 degree detection signal, when the reverse phase signal exceed the offset control voltage signal; and
    a 0 and 180 degree control signal generation circuit configured to generate the 0 and 180 degree control signal according to the 90 and 270 degree detection signal.

6. The timing signal generation circuit according to claim 2,
    wherein the timing detection circuit includes a 0, 90, 180 and 270 degree detection circuit configured to generate an inverted switch signal of the control voltage signals.

7. The timing signal generation circuit according to claim 1,
    wherein the control voltage signal generation unit includes:

a charge pump circuit configured to generate a charge signal and a discharge signal, based on the detected phase difference;

a switch configured to switch a passing state of the charge signal and the discharge signal, based on the inverted timing signal; and a loop filter configured to include a capacitance in which charging or discharging is performed by the charge signal and the discharge signal which pass through the switch.

8. The timing signal generation circuit according to claim 1, wherein the synthesized phase selection circuit generates a phase control signal in which weights of clocks of phases other than the selected clocks of two phases are zero, and wherein the phase synthesis circuit includes a plurality of current sources to which the clocks of the plurality of phases are respectively input, synthesizes the clocks by synthesizing currents of the plurality of current sources, makes the current according to the phase control signal flow through the current source to which the selected clocks of two phases are input, and stops a current of the current source to which clocks of phases other than the selected clocks of two phases are input.

9. The timing signal generation circuit according to claim 8, wherein the phase synthesis circuit biases the current source so as to be near a limit in which the current stops, when the current of the current source stops.

* * * * *